United States Patent
Jin et al.

(10) Patent No.: US 11,056,545 B2
(45) Date of Patent: *Jul. 6, 2021

(54) DISPLAY APPARATUS

(71) Applicant: SAMSUNG DISPLAY CO., LTD., Yongin-si (KR)

(72) Inventors: Changkyu Jin, Yongin-si (KR); Wonkyu Kwak, Yongin-si (KR); Kwangmin Kim, Yongin-si (KR); Kiwook Kim, Yongin-si (KR); Dongsoo Kim, Yongin-si (KR); Joongsoo Moon, Yongin-si (KR); Hyunae Park, Yongin-si (KR); Jieun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/883,513

(22) Filed: May 26, 2020

(65) Prior Publication Data

US 2020/0295098 A1  Sep. 17, 2020

Related U.S. Application Data

(63) Continuation of application No. 16/364,483, filed on Mar. 26, 2019, now Pat. No. 10,665,643, which is a (Continued)

(30) Foreign Application Priority Data

Apr. 12, 2017 (KR) .......................... 10-2017-0047589

(51) Int. Cl.
*H01L 27/32* (2006.01)
*G02F 1/1345* (2006.01)
(Continued)

(52) U.S. Cl.
CPC ........ *H01L 27/3223* (2013.01); *G02F 1/1345* (2013.01); *H01L 27/124* (2013.01);
(Continued)

(58) Field of Classification Search
CPC ... H01L 27/12; H01L 27/121; H01L 27/1218; H01L 27/124; H01L 27/32; H01L 27/322;
(Continued)

(56) References Cited

U.S. PATENT DOCUMENTS 10,243,024 B2 * 3/2019 Jin ...................... H01L 27/1218
2016/0093685 A1 3/2016 Kwon et al.
(Continued)

FOREIGN PATENT DOCUMENTS

KR 10-2017-0114040 10/2017

*Primary Examiner* — Monica D Harrison
(74) *Attorney, Agent, or Firm* — F. Chau & Associates, LLC

(57) ABSTRACT

A display apparatus includes a substrate, a display unit, a first wire unit, and a dummy unit. The substrate includes a first area, a second area, and a bending area. The bending area is disposed between a first area and a second area. The display unit is disposed in the first area. The first wire unit is electrically connected to the display unit and includes a plurality of first wires disposed on the substrate over the first area, the bending area, and the second area. The plurality of first wires include a plurality of holes disposed in the bending area and spaced apart from each other by a first pitch. The dummy wire unit includes a plurality of dummy wires disposed in the bending area.

19 Claims, 14 Drawing Sheets

Related U.S. Application Data continuation of application No. 15/871,255, filed on Jan. 15, 2018, now Pat. No. 10,243,024.

(51) Int. Cl.
| | | |
|---|---|---|
| *H01L 27/12* | (2006.01) | |
| *H01L 51/52* | (2006.01) | |
| *H01L 51/00* | (2006.01) | |
| *G02F 1/1333* | (2006.01) | |

(52) U.S. Cl.
CPC ...... *H01L 27/1218* (2013.01); *H01L 27/3262* (2013.01); *H01L 27/3279* (2013.01); *H01L 51/0097* (2013.01); *H01L 51/52* (2013.01); *G02F 1/133305* (2013.01); *H01L 27/3244* (2013.01); *H01L 2251/5338* (2013.01)

(58) Field of Classification Search
CPC ............... H01L 27/3223; H01L 27/326; H01L 27/3262; H01L 27/327; H01L 27/3279; H01L 51/00; H01L 51/009; H01L 51/0097; H01L 51/52; H01L 2251/5338; H01L 27/324; H01L 27/3244; G02F 1/1345; G02F 1/133305
USPC .......................................................... 257/40
See application file for complete search history.

(56) References Cited

U.S. PATENT DOCUMENTS

| | | |
|---|---|---|
| 2017/0288009 A1 | 10/2017 | Kim et al. |
| 2018/0301520 A1 | 10/2018 | Jin et al. |
| 2019/0221617 A1 | 7/2019 | Jin et al. |

\* cited by examiner

DISPLAY APPARATUS

CROSS-REFERENCE TO RELATED APPLICATIONS

This non-provisional application is a continuation of U.S. application Ser. No. 16/364,483 filed on Mar. 26, 2019, which is a continuation of non-provisional application is a continuation of U.S. application Ser. No. 15/871,255 filed on Jan. 15, 2018 which claims priority under 35 U.S.C. § 119 to Korean Patent Application No. 10-2017-0047589, filed on Apr. 12, 2017 in the Korean Intellectual Property Office, the disclosures of which are incorporated by reference herein in their entirety.

TECHNICAL FIELD

Exemplary embodiments of the present inventive concept relate to a display apparatus having a bendable or a flexible characteristic.

DISCUSSION OF RELATED ART

A display apparatus includes a display unit. The display unit is positioned on a substrate. As portions of the display apparatus are bent, visibility from various angles may be increased or reduced.

However, defects in the display apparatus may occur during a process of manufacturing as a display apparatus is bent. Additionally, a lifetime of the display apparatus may be reduced as the display apparatus is bent.

SUMMARY

Exemplary embodiments of the present inventive concept provide a display apparatus having a longer lifetime and minimized occurrence of a defect such as a disconnection during a manufacturing process thereof.

One or more exemplary embodiments of the present inventive concept provide a display apparatus. The display apparatus includes a substrate, a display unit, a first wire unit, and a dummy wire unit. The substrate includes a first area, a second area, and a bending area. The bending area is disposed between the first area and the second area. The bending area is configured to be bent. The display unit is disposed in the first area. The first wire unit is electrically connected to the display unit. The first wire unit includes a plurality of first wires disposed on the substrate over the first area, the bending area, and the second area. The plurality of first wires are spaced apart from each other in the bending area by a first pitch. The dummy wire unit includes a plurality of dummy wires disposed in the bending area.

The plurality of dummy wires may be spaced apart from each other by a pitch. The pitch may be substantially the same as the first pitch.

Each of the plurality of first wires may include a plurality of holes. The plurality of holes may be disposed in the bending area.

The plurality of dummy wires may include a plurality of holes.

The display apparatus may further include a second wire unit. The second wire unit may be electrically connected to the display unit. The second wire unit may include a plurality of second wires disposed on the substrate over the first area, the bending area, and the second area. The plurality of second wires may include a plurality of holes disposed in the bending area.

The dummy wire unit may be disposed between the first wire unit and the second wire unit.

The plurality of second wires may be spaced apart from each other in the bending area by a second pitch. The second pitch may be substantially the same as the first pitch.

The plurality of dummy wires may be spaced apart from each other by a pitch. The pitch may be substantially the same as the first pitch.

Each of the plurality of second wires may include a plurality of sub-wires disposed in the bending area.

The plurality of sub-wires may be spaced apart from each other by a pitch. The pitch may be substantially the same as the first pitch.

The display apparatus may further include a third wire unit. The third wire unit may be electrically connected to the display unit. The third wire unit may include a plurality of third wires disposed on the substrate over the first area, the bending area, and the second area. The plurality of third wires may include a plurality of holes disposed in the bending area. The plurality of third wires may be spaced apart from each other by a third pitch. The third pitch may be greater than the first pitch.

The third pitch may be n times the first pitch, n≥2, and n is a natural number.

At least one or more of the plurality of dummy wires may be disposed between the plurality of third wires in the bending area.

The plurality of dummy wires disposed between the plurality of third wires may be spaced apart from each other by a pitch. The pitch may be substantially the same as the first pitch.

A third wire of the plurality of third wires and a dummy wire from the plurality of dummy wires adjacent to each other may be spaced apart from each other by a pitch. The pitch may be substantially the same as the first pitch.

The dummy wire unit might be not electrically connected to the display unit.

The display apparatus may further include an inorganic insulating layer. The inorganic insulating layer may be disposed on the substrate. The inorganic insulating layer may include an opening corresponding to the bending area. Ends of each of the plurality of dummy wires may extend outside the opening.

The display apparatus may further include an organic layer. The organic layer my fill at least portions of the opening. The organic layer may be disposed between the substrate and the first wire unit and between the substrate and the dummy wire unit. Ends of each of the plurality of dummy wires may extend to outside the organic layer.

An end of each of the plurality of dummy wires may be disposed in the first area. Another end of each of the plurality of dummy wires may be disposed in the second area.

An insulating film may be disposed on ends of each of the plurality of dummy wires. The insulating film may cover ends of each of the plurality of dummy wires.

The display apparatus may further include a thin film transistor. The thin film transistor may be disposed in the first area or the second area. The thin film transistor may include a source electrode, a drain electrode, and a gate electrode. The plurality of dummy wires may include substantially a same material as a material included in the source electrode or the drain electrode.

A portion of the plurality of first wires disposed in the bending area may include substantially a same material as a material included in the source electrode or the drain electrode. A portion of the plurality of first wires disposed in the first area and the second area may include substantially a same material as a material included in the gate electrode.

One or more exemplary embodiments of the present inventive concept provide a display apparatus. The display apparatus includes a substrate, a display unit, a plurality of first wires, and a plurality of dummy wires. The substrate includes a first area, a second area, and a bending area. The bending area is disposed between the first area and the second area. The bending area is configured to be bent with respect to a bending axis extending in a first direction. The display unit is disposed in the first area. The plurality of first wires are disposed in the bending area. The plurality of first wires are electrically connected to the display unit. The plurality of dummy wires are disposed in the bending area. The plurality of dummy wires are not electrically connected to the display unit. Each of the plurality of first wires and the plurality of dummy wires include a plurality of holes disposed in the bending area. Each of the plurality of first wires and each of the plurality of dummy wires are spaced apart from each other in the bending area by a same pitch.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION OF THE EMBODIMENTS

Figure 1:
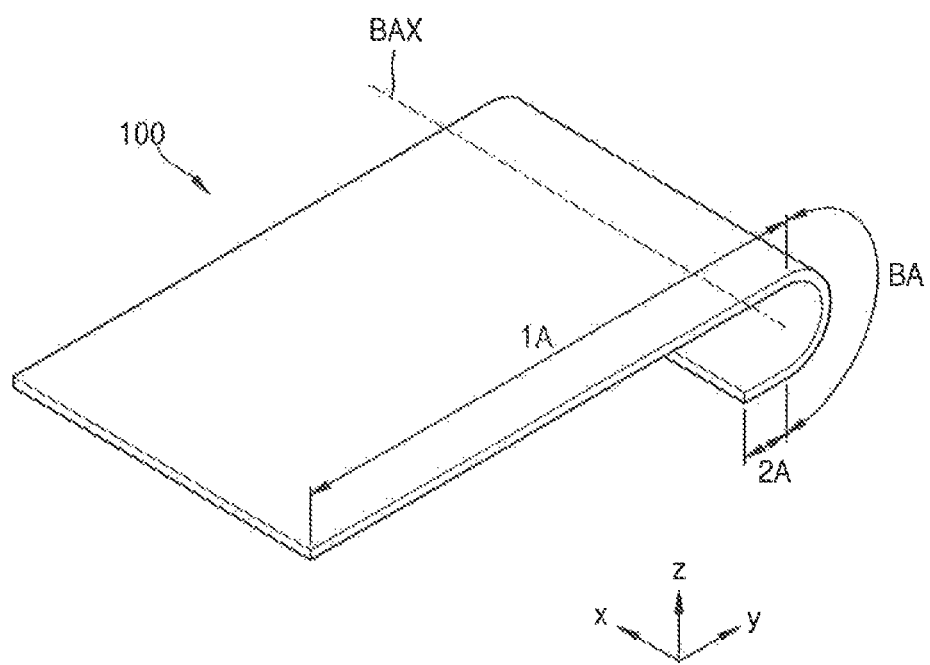
FIG. 1 is a perspective view illustrating a portion of a display apparatus according to an exemplary embodiment of the present inventive concept.

As exemplary embodiments of the present inventive concept allow for various changes and numerous embodiments, certain embodiments will be illustrated in the drawings and described in detail herein. Exemplary embodiments of the present inventive concept may, however, be embodied in many different forms and should not be construed as being limited to the exemplary embodiments set forth herein.

Reference will now be made in detail to exemplary embodiments of the present inventive concept, examples of which are illustrated in the accompanying drawings, wherein like reference numerals refer to like elements throughout, and repeated descriptions thereof may be omitted.

It will be understood that although the terms "first", "second", etc. may be used herein to describe various components, these components should not be limited by these terms. These components are only used to distinguish one component from another.

In the following examples, the x-axis, the y-axis and the z-axis are not limited to three axes of the rectangular coordinate system, and may be interpreted in a broader sense. For example, the x-axis, the y-axis, and the z-axis may be substantially perpendicular to one another, or may represent different directions that are not substantially perpendicular to one another.

Figure 2:
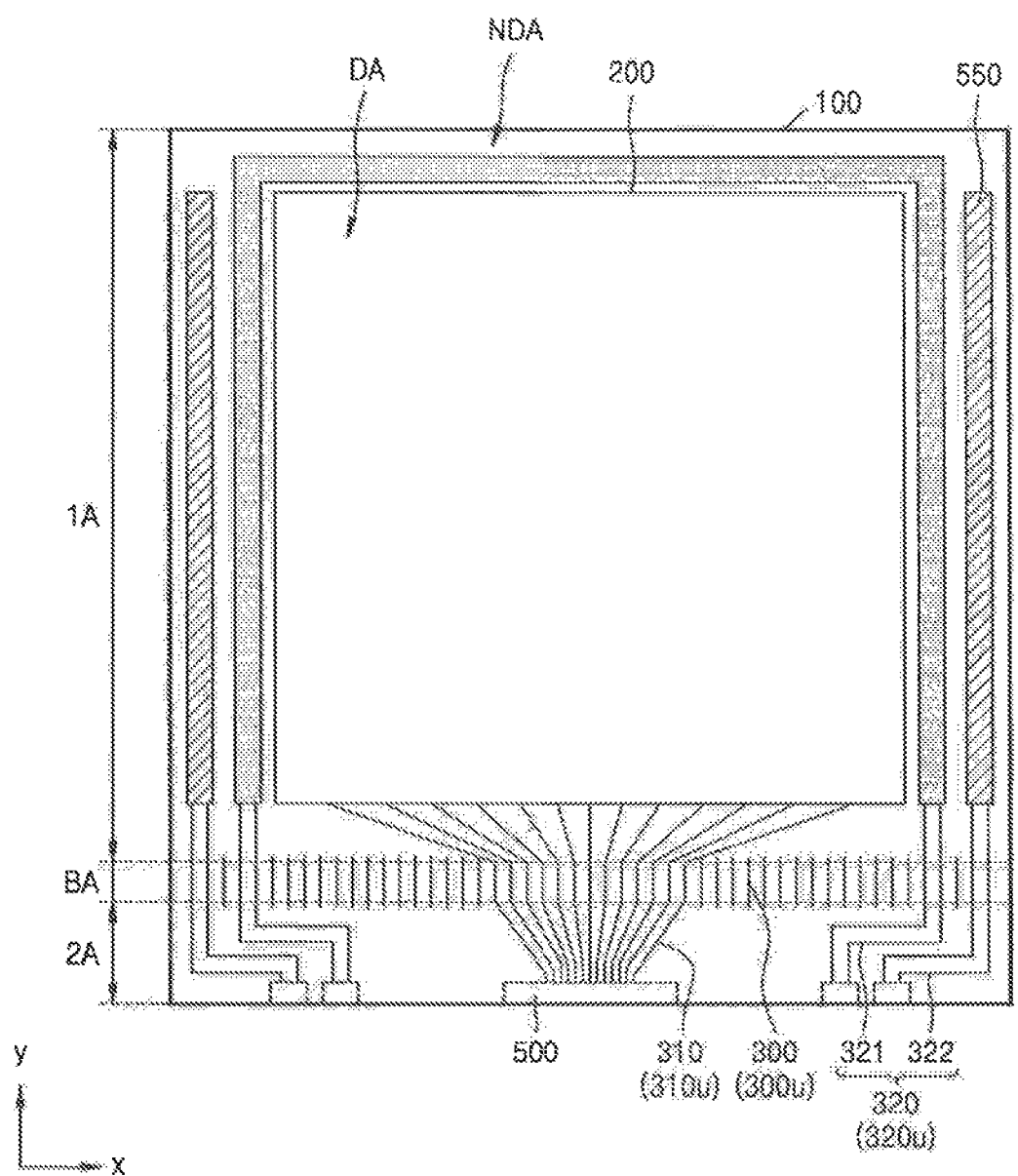
FIG. 2 is a planar view illustrating a portion of a display apparatus of FIG. 1 according to an exemplary embodiment of the present inventive concept.

FIG. 1 is a perspective view illustrating a portion of a display apparatus according to an exemplary embodiment of the present inventive concept. FIG. 2 is a planar view illustrating a portion of a display apparatus of FIG. 1 according to an exemplary embodiment of the present inventive concept.

Referring to FIG. 1, a display apparatus according to an exemplary embodiment of the present inventive concept may include a substrate 100. A portion of the substrate 100 may be bent, for example, as illustrated in FIG. 1. Thus, a portion of the display apparatus may have a bent form similar to a bent form of the substrate 100. FIG. 2 illustrates a state in which the display apparatus is not bent. In cross-sectional views or planar views of exemplary embodiments of the present inventive concept described herein, a display apparatus in an unbent state will be described in more detail.

Referring to FIGS. 1 and 2, the substrate 100 included in a display apparatus according to an exemplary embodiment of the present inventive concept may include a bending area BA. The bending area BA may extend in a first direction (e.g., a +y direction). The bending area BA may be positioned between a first area 1A and a second area 2A, for example, in a second direction (e.g., a +x direction). The first direction may intersect with the first direction. Referring to FIG. 1, the substrate 100 may be bent corresponding to a bending axis BAX. The bending axis BAX may extend in the first direction (e.g., a +y direction).

The substrate 100 may include various materials having a flexible or a bendable characteristic. For example, the substrate 100 may include a polymer resin such as polyethersulfone (PES), polyacrylate (PAR), polyetherimide (PEI), polyethylene napthalate (PEN), polyethyelene terepthalate (PET), polyphenylene sulfide (PPS), polyarylate, polyimide (PI), polycarbonate (PC), or cellulose acetate propionate (CAP).

The first area 1A may include a display area DA and a non-display area NDA. The non-display area NDA may be disposed outside the display area DA. Referring to FIG. 2, the first area 1A may include the display area DA and a portion of a non-display area NDA disposed outside of the display area DA. The second area 2A may include the non-display area NDA. The bending area BA may be disposed between the first area 1A and the second area 2A. The bending area BA may include the non-display area NDA.

Referring to FIG. 2, a first wire unit 310u and a second wire unit 320u may be disposed on the substrate 100. The first wire unit 310u and the second wire unit 320u may be disposed in the non-display area NDA. The first wire unit 310u and the second wire unit 320u may be disposed in each of the first area 1A, the bending area BA, and the second area 2A. Thus, a portion of each of the first wire unit 310u and the second wire unit 320u may overlap the bending area BA and be disposed on the bending area BA. The first wire unit 310u may include a plurality of first wires 310. The second wire unit 320u may include a plurality of second wires 320.

Each of the first wire unit 310u and the second wire unit 320u may be electrically connected to a display unit 200. The display unit 200 may be disposed in the display area DA of the substrate 100. The first wire unit 310u may be a wire for transmitting a data signal to the display unit 200. For example, the first wire unit 310u may be a data line. The second wire unit 320u may be disposed separate from the first wire unit 310u. The second wire unit 320u may include a data line, a power wire 321 and a driving circuit wire 322. The power wire 321 may supply a power to the display unit 200. The driving circuit wire 322 may apply a signal, for example, to a scan driving circuit 550. The scan driving circuit 550 may be a shift register. For example, the power wire 321 may be an ELVDD, ELVSS, or the like. The driving circuit wire 322 may be a scan line, a gate line, or the like.

According to an exemplary embodiment of the present inventive concept, the first wire unit 310u and the second wire unit 320u may include one or more metals including molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), titanium (Ti), tungsten (W), and/or copper (Cu). The first wire unit 310u may have a single-layered structure or a multi-layered structure. The second wire unit 320u may have a single-layered structure or a multi-layered structure.

A pad unit 500 may be disposed at an edge of the substrate 100. For example, the pad unit 500 may be disposed at an edge of the substrate 100 where ends of the first wire unit 310u and the second wire unit 320u are located. A chip or the like may be attached to the pad unit 500. The chip may be separately prepared from the display apparatus. The first wire unit 310u and the second wire unit 320u may each transmit a signal applied to the pad unit 500 to the display unit 200, for example, via the chip.

The display apparatus according to an exemplary embodiment of the present inventive concept may include a dummy wire unit 300u. The dummy wire unit 300u may be disposed on the bending area BA. The dummy wire unit 300u may include a plurality of dummy wires 300. The plurality of dummy wires 300 disposed on the bending area BA may be substantially parallel to each of the plurality of first wires 310 and the plurality of second wires 320 disposed on the bending area BA. For example, the plurality of dummy wires 300, the plurality of first wires 310, and the plurality of second wire 320 may be substantially parallel to each other. Referring to FIG. 2, the plurality of first wires 310 and the plurality of second wires 320 disposed on the bending area BA may be substantially parallel to the first direction (e.g., the +y direction). The plurality of first wires 310 may be spaced apart from the plurality of second wires 320. The plurality of dummy wires 300 may be disposed between the plurality of first wires 310 and the plurality of second wires 320. The plurality of dummy wires 300 may be disposed between the plurality of second wires 320.

The dummy wire unit 300u might not be electrically connected to the display unit 200. The first wire unit 310u and the second wire unit 320u may each be electrically connected to the display unit 200. Accordingly, a substantial portion of the dummy wire unit 300u may be disposed on the bending area BA. The dummy wire unit 300u may extend to portions of the first area 1A and the second area 2A. The dummy wire unit 300u might not transmit an electrical signal. Thus, the dummy wire unit 300u might not be connected to the display unit 200 or the pad unit 500.

According to an exemplary embodiment of the present inventive concept, the dummy wire unit 300u may include one or more metals including molybdenum (Mo), aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), titanium (Ti), tungsten (W), and/or copper (Cu). The dummy wire unit 300u may have a single-layered structure or a multi-layered structure.

Figure 3:
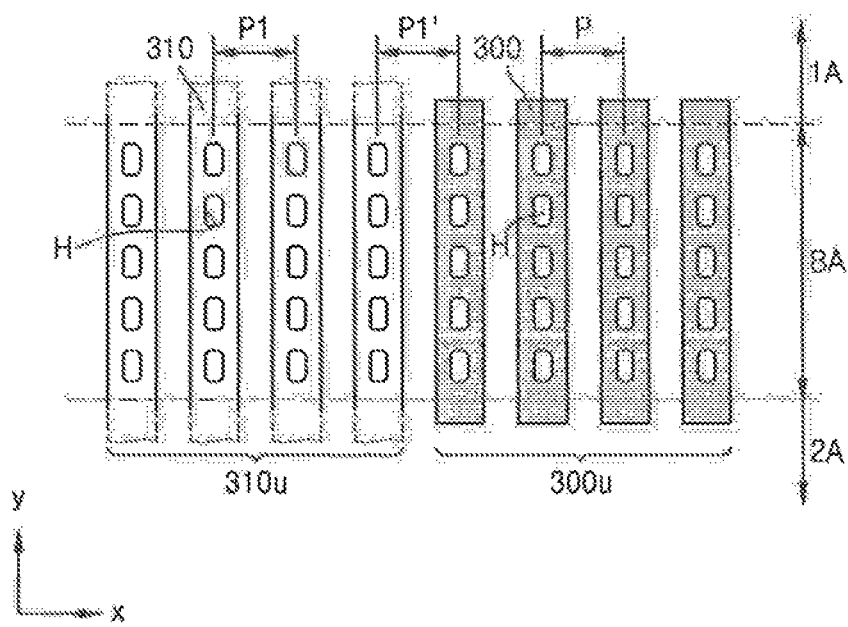
FIG. 3 is a planar view illustrating a portion of a display apparatus according to an exemplary embodiment of the present inventive concept.

FIG. 3 is a planar view illustrating a portion of a display apparatus according to an exemplary embodiment of the present inventive concept. FIG. 3 illustrates a magnified view of a display apparatus according to an exemplary embodiment of the present inventive concept, and more particularly a portion of the first wire unit 310u and the dummy wire unit 300u disposed in the bending area BA.

Referring to FIG. 3, the first wire unit 310u may be positioned on one side of the bending area BA. The dummy wire unit 300u may be adjacent to the first wire unit 310u. For example, the plurality of first wires 310 of the first wire unit 310u may be disposed to be spaced apart from each other by a predetermined distance. An electrical wire might not be located on either side of the first wire unit 310u. The dummy wire unit 300u may be disposed on either side of the first wire unit 310u.

When wires are disposed on a non-display area of a substrate in a straight line form (e.g., a solid form) and a portion of the non-display area is bent, stress may be concentrated in a portion of the wires located in a bending area. Thus, a formation of a crack in the wires and an occurrence of a defect such as a disconnection of the wires may occur.

In the display apparatus according to an exemplary embodiment of the present inventive concept, the plurality of first wires 310 included in the first wire unit 310u may include a plurality of holes H. The plurality of holes H may be disposed in the bending area BA. The first wires 310 positioned in the first area 1A or the second area 2A might not include the plurality of holes H. The plurality of first wires 310 located in the first area 1A or the second area 2A may also include the holes H. The plurality of first wires 310 disposed in the bending area BA may include the holes H. Thus, a concentration of stress in the bending area BA when the display apparatus is bent may be reduced.

Referring to FIG. 3, the plurality of dummy wires 300 included in the dummy wire unit 300*u* may include the plurality of holes H in the bending area BA. As described above, the dummy wire unit 300*u* may be disposed on the bending area BA and might not be electrically connected to the display unit 200 or the pad unit 500. Thus, the plurality of dummy wires 300 included in the dummy wire unit 300*u* may include the plurality of holes H.

The plurality holes H described above may be formed such that they substantially pass through each of the plurality of dummy wires 300 and the plurality of first wires 310, for example, including metal layers, in a plane (e.g., an x-y plane) of a planar view. Thus, the plurality of dummy wires 300 and the plurality of first wires 310 according to an exemplary embodiment of the present inventive concept may be in a patterned form including the plurality holes H in the bending area BA. The terms "the formation" and "the form" may refer to a planar form (e.g., an x-y plane) of the plurality of dummy wires 300 and the plurality of first wires 310 as a whole. Thus, the terms "the formation" and "the form" might not refer to individual differences between widths, lengths, or thicknesses of the plurality of dummy wires 300 and the plurality of first wires 310.

Referring to FIG. 3, the plurality of first wires 310 may be spaced apart from each other by a first pitch P1. Thus, the plurality of first wires 310 may be spaced apart from each other by substantially a same distance. The term "pitch" as used herein may refer to a distance between central axes of two adjacent wires of the plurality of first wires 310. Thus, the term "pitch" according to an exemplary embodiment of the present inventive concept described herein might not refer to an interval or a distance between two directly adjacent wires, but a distance between two central axes. When each width of the plurality of first wires 310 located on the bending area BA is substantially the same, the plurality of first wires 310 may be spaced apart by the first pitch P1. Thus, an interval or a distance between the first plurality wires 310 may be substantially the same.

According to an exemplary embodiment of the present inventive concept, the plurality of dummy wires 300 disposed in the bending area BA may be spaced apart by a pitch P. The pitch P may be substantially the same as the first pitch P1 of the plurality of first wires 310. In the bending area BA, the dummy wire unit 300*u* may be disposed adjacent to the first wire unit 310*u*. The dummy wire unit 300*u* may be disposed in an area where electrical wires are not disposed.

Since the dummy wire unit 300*u* may be disposed adjacent to the first wire unit 310*u*, a first wire 310 of the plurality first wires 310 most adjacent to the dummy wire unit 300*u* may be spaced apart from the plurality of dummy wires 300 by a pitch P1'. The pitch P1' may be substantially the same as the first pitch P1. Thus, the first pitch P1 and pitches P and P1' of the dummy and first wires 300 and 310 in the bending area BA may be substantially the same. Additionally, the first wire unit 310*u* and the dummy wire unit 300*u* may be spaced apart from each other by the pitch P1'.

The display apparatus according to an exemplary embodiment of the present inventive concept may have a structure in which the plurality of holes H are formed in the plurality of dummy wires 300, the plurality of first wires 310, and the plurality of second wires 320 located in the bending area BA. The plurality of holes H may increase flexibility of the plurality of dummy wires 300, the plurality of first wires 310, and the plurality of second wires 320. The plurality of holes H may be several micro-meters. The plurality of holes H may be formed by a deliberate patterning operation.

According to an exemplary embodiment of the present inventive concept, when the dummy wire units 300*u* are not formed in the same structure, the plurality of holes H might not be sufficiently formed in the outermost wires of the plurality of first wires 310 of the first wire unit 310*u*. The plurality of holes H not being formed in a manner may indicate defects in which the plurality of holes H are formed smaller than intended, have different sizes, or the like.

In the display apparatus according to an exemplary embodiment of the present inventive concept, the dummy wire unit 300*u* may be positioned adjacent to the first wire unit 310*u*. The plurality of dummy wires 300 may be spaced apart from each other by the pitch P. The pitch P may be substantially the same as the first pitch P1 of the plurality of first wires 310 of the first wire unit 310*u*. Pattern densities of the plurality of dummy wires 300 and the plurality of first wires 310 disposed on the bending area BA may be substantially equal, for example, due to a pattern compensation structure of the dummy wire unit 300*u*. Thus, when the plurality of holes H are formed in the plurality of dummy wires 300 and the plurality of first wires 310 positioned on the bending area BA by patterning, for example, by uniform patterning may be performed with relative ease.

Figure 4:
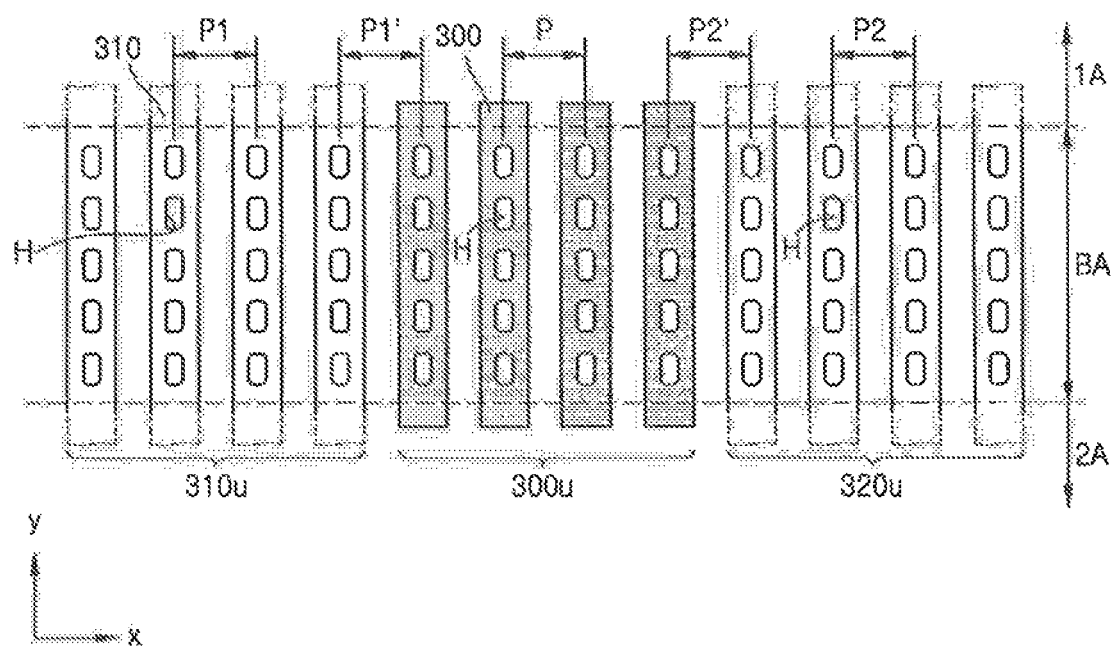
FIG. 4 is a planar view illustrating a portion of a display apparatus according to an exemplary embodiment of the present inventive concept.

FIG. 4 is a planar view illustrating a portion of a display apparatus according to an exemplary embodiment of the present inventive concept. FIG. 4 illustrates a magnified view of a display apparatus according to an exemplary embodiment of the present inventive concept, and more particularly a portion including a first wire unit 310*u*, a second wire unit 320*u*, and a dummy wire unit 300*u* positioned in the bending area BA.

Referring to FIG. 4, the first wire unit 310*u* may be disposed at one side of the bending area BA. The second wire unit 320*u* may be disposed at another side of the bending area BA. The dummy wire unit 300*u* may be disposed between the first wire unit 310*u* and the second wire unit 320*u*. Thus, the first wire unit 310*u* may be spaced apart from the second wire unit 320*u* by a predetermined distance, and an electrical wire might not be disposed between the first wire unit 310*u* and the second wire unit 320*u*. The dummy wire unit 300*u* may be disposed between the first wire unit 310*u* and the second wire unit 320*u*.

When wires of a straight form (e.g., a solid form) are disposed on a non-display area of a substrate and a portion of the non-display area is bent, stress may be concentrated in a portion of the wires disposed in a bending area. Thus, a formation of a crack of the wires and a defect such as a disconnection of the wires may occur.

In the display apparatus according to an exemplary embodiment of the present inventive concept, the plurality of first wires 310 included in the first wire unit 310*u* may include the plurality holes H in the bending area BA. The plurality of second wires 320 included in the second wire unit 320*u* may include the plurality of holes H in the bending area BA. The plurality of first wires 310 and the plurality of second wires 320 disposed in the first area 1A or the second area 2A might not include the plurality of holes H. The plurality of first wires 310 and the plurality of second wires 320 disposed in the first area 1A or the second area 2A may also include the plurality of holes H. However, the plurality of first wires 310 and the plurality of second wires 320 may include the plurality of holes H in the bending area BA. Thus, when the bending area BA is bent, a concentration of stress may be reduced.

The plurality of dummy wires 300 included in the dummy wire unit 300u may also include the plurality of holes H in the bending area BA. As described above, the dummy wire unit 300u may be disposed on the bending area BA. The dummy wire unit 300u might not be electrically connected to the display unit 200 or the pad unit 500. Thus, the plurality of dummy wires 300 may include the plurality of holes H.

The plurality of holes H described above may be formed such that they pass through each of the plurality of dummy wires 300, the plurality of first wires 310, and the plurality of second wires 320, for example, including metal layers, on a plane (e.g., the x-y plane) of the planar view. Thus, the plurality of dummy wires 300, the plurality of first wires 310, and the plurality of second wires 320 may have a patterned form including the plurality of holes H in the bending area BA. The terms "the formation" and "the form" as used herein may refer to a planar form (e.g., the x-y plane) of the plurality of dummy wires 300, the plurality of first wires 310, and the plurality of second wires 320 as a whole. Thus, the terms "the formation" and "the form" might not refer to individual differences between widths, lengths, or thicknesses of the plurality of dummy wires 300, the plurality of first wires 310, and the plurality of second wires 320.

Referring to FIG. 4, the plurality of first wires 310 may be spaced apart from each other by a first pitch P1. Thus, the plurality of first wires 310 may be spaced apart from each other by substantially a same distance. The term "pitch" as used herein may refer to a distance between the central axes of two adjacent wires among the plurality of first wires 310. Thus, the term "pitch" according to an exemplary embodiment of the present inventive concept described herein might not refer to an interval or a distance between two adjacent wires, but a distance between two central axes. When each width of the plurality of first wires 310 disposed in the bending area BA is substantially the same, the plurality of first wires 310 may be spaced apart by the first pitch P1. Thus, an interval or a distance between the plurality of first wires 310 may be substantially the same.

According to an exemplary embodiment of the present inventive concept, the plurality of second wires 320 of the second wire units 320u disposed in the bending area BA may be spaced apart from each other by a second pitch P2. Thus, the plurality of second wires 320 may be spaced apart from each other by substantially a same distance. The second pitch P2 may be substantially the same as the first pitch P1. Each of the plurality of first wires 310 and each of the plurality of second wires 320 may be spaced apart from each other by substantially a same pitch.

According to an exemplary embodiment of the present inventive concept, the plurality of dummy wires 300 disposed in the bending area BA may be spaced apart by a pitch P. The pitch P may be substantially the same as the first pitch P1 of the plurality of first wires 310. The dummy wire unit 300u may be disposed in an area between the first wire unit 310u and the second wire unit 320u. The dummy wire unit 300u may be disposed in the bending area BA. The dummy wire unit 300u may be disposed in an area in which electrical wires are not located.

When the dummy wire unit 300u is disposed between the first wire unit 310u and the second wire unit 320u, a first wire 310 of the plurality of first wires 310 most adjacent to the dummy wire unit 300u may be spaced apart from the dummy wire unit 300u by a pitch P1'. The pitch P1' may be substantially the same as the first pitch P1. A second wire 320 of the plurality of second wires 320 most adjacent to the dummy wire unit 300u may be spaced apart from the dummy wires 300 by a pitch P2'. The pitch P2' may be substantially the same as the second pitch P2. As described above, the second pitch P2 and the first pitch P1 may be substantially the same. Thus, the pitches P1, P1', P2, P2', and P of the plurality of dummy wires 300, the plurality of first wires 310, and the plurality of second wires 320 positioned in the bending area BA may be substantially same as each other.

As described above, the display apparatus according to an exemplary embodiment of the present inventive concept may include a structure including the plurality of holes H in the plurality of dummy wires 300, the plurality of first wires 310, and the plurality of second wires 300. The plurality of holes H may be disposed in the bending area BA. The plurality of holes H may be formed to be several micrometers. The plurality of holes H may be formed by a precise patterning operation.

As an example, when dummy wire units 300u are not formed in the same structure, the plurality of holes H might not formed in a "standard" manner in first wires 310 disposed at an outer side from among the first wires 310 of the first wire unit 310u, or second wires 320 disposed at an outer side from among the second wires 320 of the second wire unit 320u. Here, the holes H not being formed in a "standard" manner may indicate defects of holes H in which the holes H are formed smaller than intended, having different sizes, or the like.

In the display apparatus according to an exemplary embodiment of the present inventive concept, the dummy wire unit 300u may be disposed between the first wire unit 310u and the second wire unit 320u. The plurality of dummy wires 300 may be spaced apart from the first wire units 310u and the second wire units 320u by the same pitch P. Pattern densities of the plurality of dummy wires 300, the plurality of first wires 310, and the plurality of second wires 320 disposed in the bending area BA may be substantially equal to each other, for example, due to a pattern compensation structure of the dummy wire unit 300u. Thus, when the plurality of holes H are formed in the plurality of dummy wires 300, the plurality of first wires 310, and the plurality of second wires 320 disposed in the bending area BA by patterning, uniform patterning may be performed with relative ease.

Figure 5:
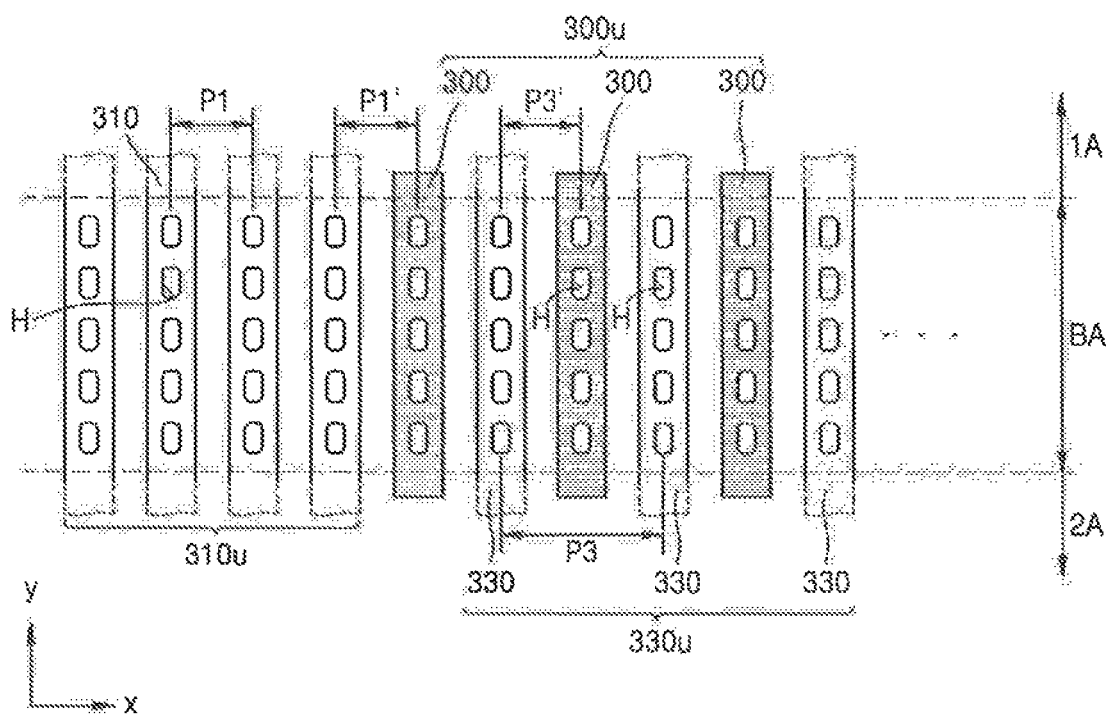
FIG. 5 is a planar view illustrating a portion of a display apparatus according to an exemplary embodiment of the present inventive concept.
Figure 6:
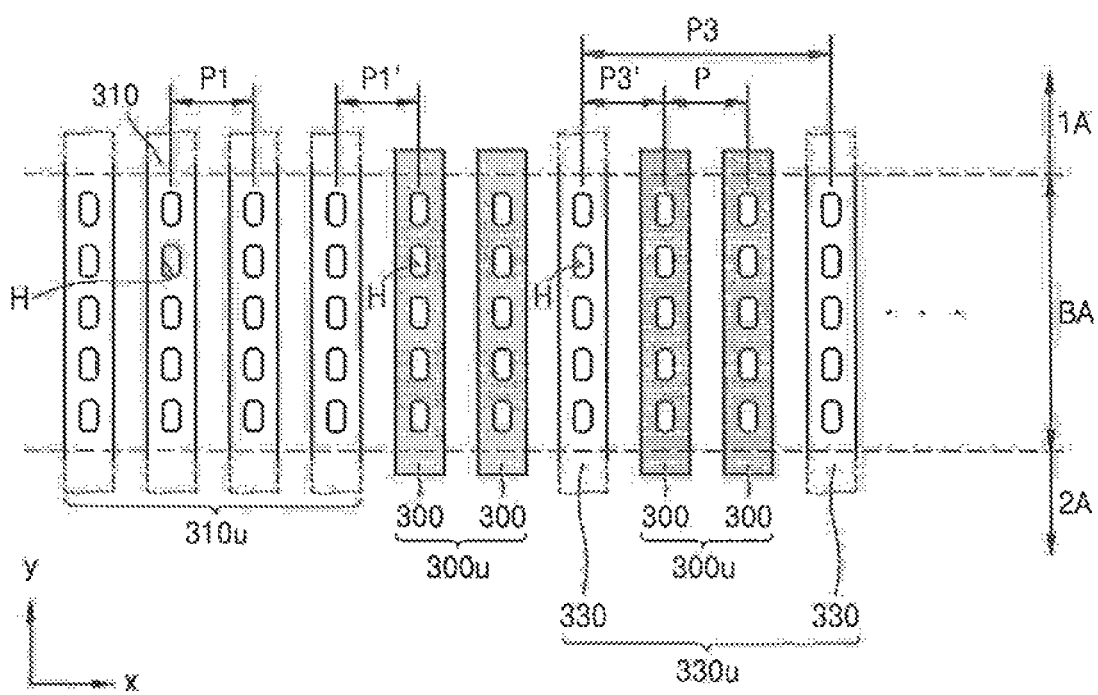
FIG. 6 is a planar view illustrating a portion of a display apparatus according to an exemplary embodiment of the present inventive concept.

FIG. 5 is a planar view illustrating a portion of a display apparatus according to an exemplary embodiment of the present inventive concept. FIG. 6 is a planar view illustrating a portion of a display apparatus according to an exemplary embodiment of the present inventive concept.

Referring to FIG. 5, a first wire unit 310u may be positioned in one side of the bending area BA. A third wire unit 330u may be positioned in another side of the bending area BA. For example, the third wire unit 330u may be disposed adjacent to the first wire unit 310u. A dummy wire unit 300u may be disposed between third wire units 330u. According to an exemplary embodiment of the present inventive concept, a position and a form of the first wire unit 310u may be substantially the same as embodiments described above. Thus, repetitive descriptions thereof may be omitted.

The third wire unit 330u may include a plurality of third wires 330. Similar to the first wire unit 310u, the third wire unit 330u may be a wire for transmitting a data signal to the display unit 200. For example, the third wire unit 330u may be a data line. According to an exemplary embodiment of the present inventive concept, the third wire unit 330u may be a power wire, for example, for supplying power to the display unit 200. The third wire unit 330u may be a driving circuit wire, for example, for applying a signal to a scan driving circuit.

When wires are disposed on a non-display area of a substrate in a straight line form (e.g., solid form) and a portion of the non-display area is bent, stress may be concentrated in a portion of the wires disposed in a bending area. Thus, a formation of a crack in the wires and a defect such as a disconnection of the wires may occur.

In the display apparatus according to an exemplary embodiment of the present inventive concept, the first wires 310 included in the first wire unit 310u may include the plurality of holes H in the bending area BA. The plurality of third wires 330 included in the third wire unit 330u may include the plurality of holes H in the bending area BA. The plurality of dummy wires 300 included in the dummy wire unit 300u may include the plurality of holes H in the bending area BA.

The plurality of third wires 330 included in the third wire unit 330u may be spaced apart from each other by a third pitch P3. The third pitch P3 by which the plurality of third wires 330 are spaced apart from each other may be greater than the first pitch P1 by which the plurality of first wires 310 are spaced apart from each other. The plurality of dummy wires 300 may be disposed between the plurality of third wires 330. Referring to FIG. 5, a single dummy wire 300 may be disposed between adjacent third wires 330; however, the number of dummy wires 300 disposed between the plurality of third wires 330 may be at least one or more. The number of dummy wires 300 disposed between the plurality of third wires 330 may depend on an interval of the third pitch P3 by which the plurality of third wires 330 are disposed.

FIG. 6 is a planar view illustrating a portion of a display apparatus according to an exemplary embodiment of the present inventive concept. FIG. 6 illustrates a structure in which the plurality of dummy wires 300 are disposed between the plurality of third wires 330.

In a structure in which the plurality of dummy wires 300 and the plurality of the third wires 330 are alternately disposed alternately, a dummy wire 300 of the plurality of dummy wires 300 most adjacent to a third wire 330 may be formed to be spaced apart by a pitch P3'. The pitch P3' may be substantially the same as the first pitch P1. An interval between a first wire 310 of the first wires 310 most adjacent to the dummy wire 300 and a dummy wire may be formed to be a pitch P1'. The pitch P1' may be substantially the same as the first pitch P1. Thus, the plurality of dummy wires 300, the plurality of first wires 310, and the plurality of third wires 330 disposed in the bending area BA may be spaced apart from each other by substantially the same pitch.

According to an exemplary embodiment of the present inventive concept, the third pitch P3 may be formed to be n times greater than the first pitch P1 (n≥2, n is a natural number). As described above, when at least one or more dummy wires 300 are formed between the third wires 330 disposing each of the plurality of dummy wires 300, the plurality of first wires 310, and the plurality of third wires 330 in the bending area BA by the same pitch, the third pitch P3 may be formed to be n times the first pitch P1 (n≥2, n is a natural number). For example, when the third pitch P3 is formed to be two times the first pitch P1, one dummy wire 300 may be disposed between the plurality third wires 330. Referring to FIG. 6, when the third pitch P3 is formed to be three times the first pitch P1, two dummy wires 300 may be disposed between the plurality of third wires 330. According to an exemplary embodiment of the present inventive concept, for example, when the third pitch P3 is formed to be four times the first pitch P1, three dummy wires 300 may be disposed between the plurality of third wires 330.

Referring to FIG. 6, the dummy wire unit 300u may be disposed between the first wire unit 310u and the third wire unit 330u. The dummy wire unit 300u may also be disposed between the plurality of third wires 330. The dummy wire unit 300u may include a plurality of dummy wires 300. The plurality of dummy wires 300 may be spaced apart from each other by a pitch P. The pitch P may be substantially the same as the first pitch P1 of the first plurality of wires 310.

As described above, the display apparatus according to an exemplary embodiment of the present inventive concept may have a structure in which the plurality of holes H are formed in the plurality of dummy wires, the plurality of first wires 310, and the plurality of third wires 330 positioned in the bending area BA and may provide flexibility. The plurality of holes H may be formed to be several micrometers. The plurality of holes H may be formed by a precise patterning operation.

As an example, when dummy wire units 300u are not formed in the same structure, holes H might not be formed in a "standard" manner in first wires 310 disposed at an outer side from among the plurality of first wires 310 of the first wire unit 310u. Holes H might also not be formed in a "standard" manner in the third wires 330 of the third wire unit 330u having the third pitch P3 greater than the first pitch P1 of the plurality of first wires 310. Holes H not being formed in a "standard" manner may indicate a defect of holes H in which the holes H are formed smaller than intended, having different sizes, or the like.

In the display apparatus according to an exemplary embodiment of the present inventive concept, the dummy wire unit 300u may be positioned between the first wire unit 310u and the second wire unit 320u. The plurality of dummy wires 300 may be spaced apart from the first wire units 310u and the second wire units 320u by the same pitch. Pattern densities of the plurality of dummy wires 300, the plurality of first wires 310, and the plurality of second wires 320 disposed in the bending area BA may be substantially equal to each other, for example, due to a pattern compensation structure of the dummy wire unit 300u. Thus, when the plurality of holes H are formed in the plurality of dummy wires 300, the plurality of first wires 320, and the plurality of second wires 320 disposed in the bending area BA by patterning, uniform patterning may be performed with relative ease.

Figure 7:
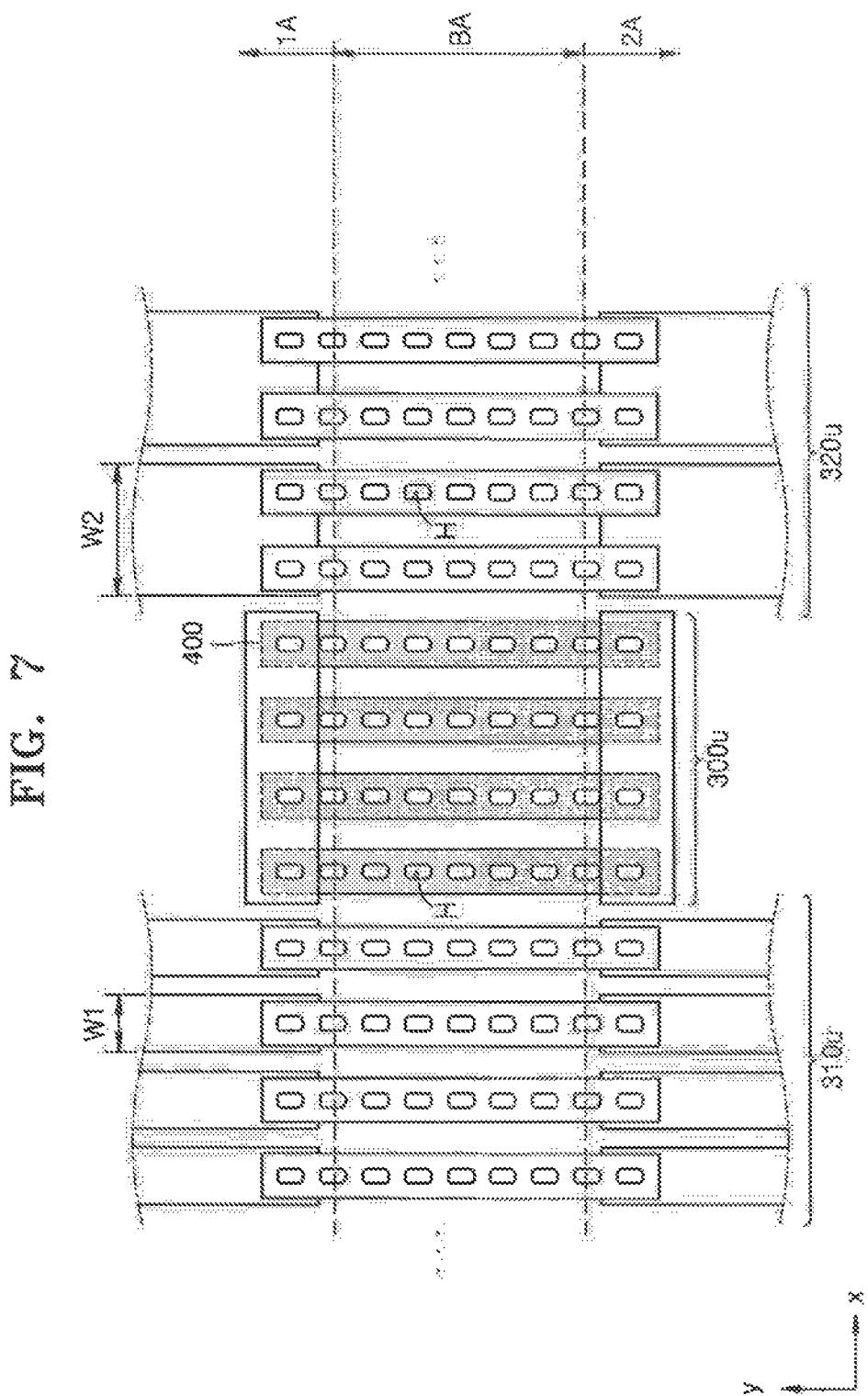
FIG. 7 is a planar view illustrating a portion of a display apparatus according to an exemplary embodiment of the present inventive concept.

FIG. 7 is a planar view illustrating a portion of a display apparatus according to an exemplary embodiment of the present inventive concept.

Referring to FIG. 7, a line width w1 of the first wire unit 310u may be different from a line width w2 of the second wire unit 320u. For example, in the first area 1A and the second area 2A excluding the bending area BA, the line width w2 of the second wire unit 320u may be greater than the line width w1 of the first wire unit 310u in the first area 1A and the second area 2A. Additionally, pitches of the first wire unit 310u and the second wire unit 320u may be different from each other. For example, the pitch of the second wire unit 320u may be greater than the pitch of the first wire unit 310u.

The second wire unit 320u may include a plurality of second wires 320 in the bending area BA. Thus, the second wire unit 320u may be provided in multi-line manner and may have substantially the same pitch as the first wire unit 310*u* or the dummy wire unit 300*u* in the bending area BA. Therefore, the first wire unit 310*u*, the second wire unit 320*u*, and the dummy wire unit 300*u* disposed adjacent to the second wire unit 320*u* in the bending area may also be formed to have substantially the same line widths and pitches as each other.

Figure 8:
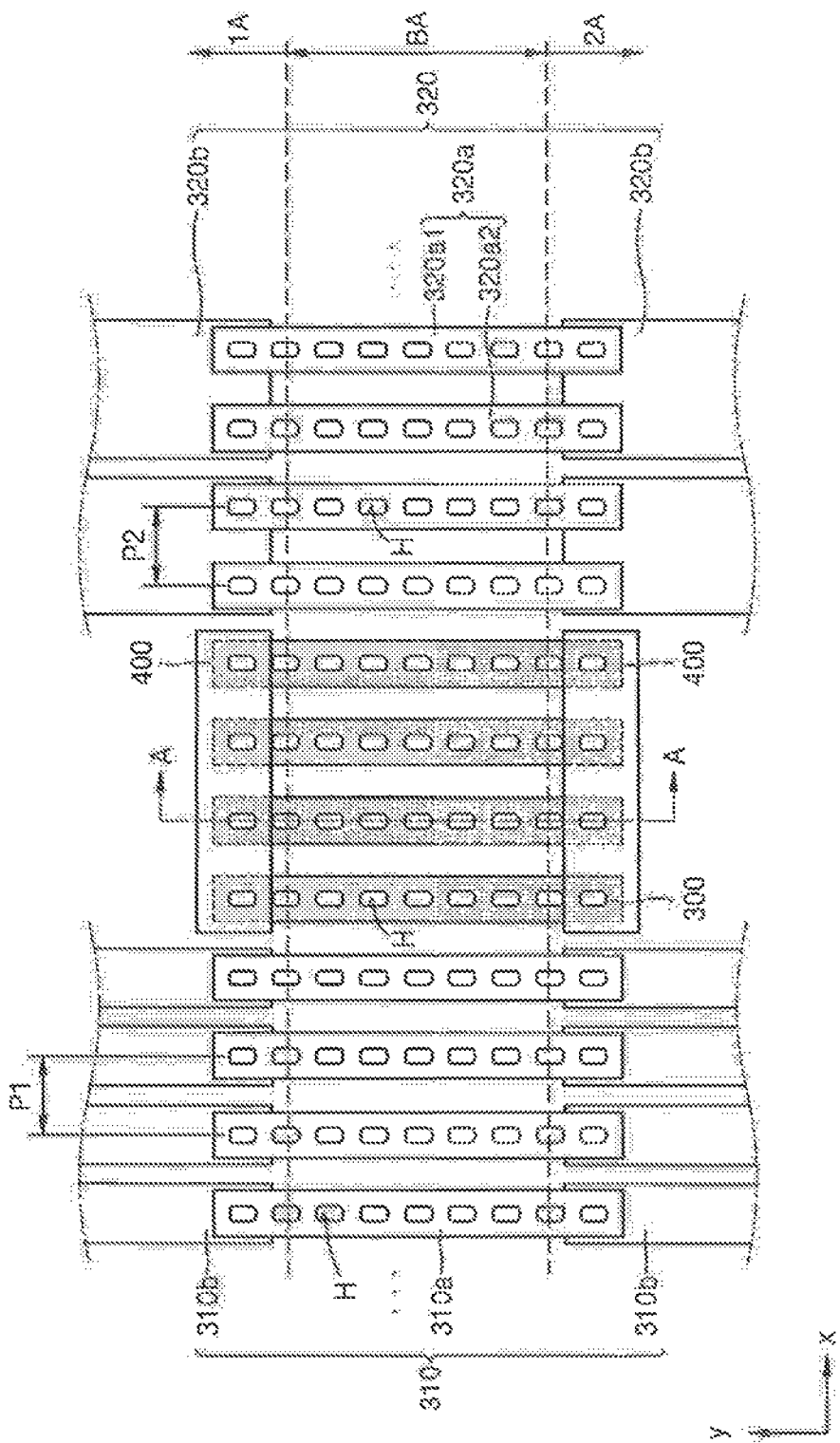
FIG. 8 is a planar view illustrating a portion of a display apparatus according to an exemplary embodiment of the present inventive concept.
Figure 9:
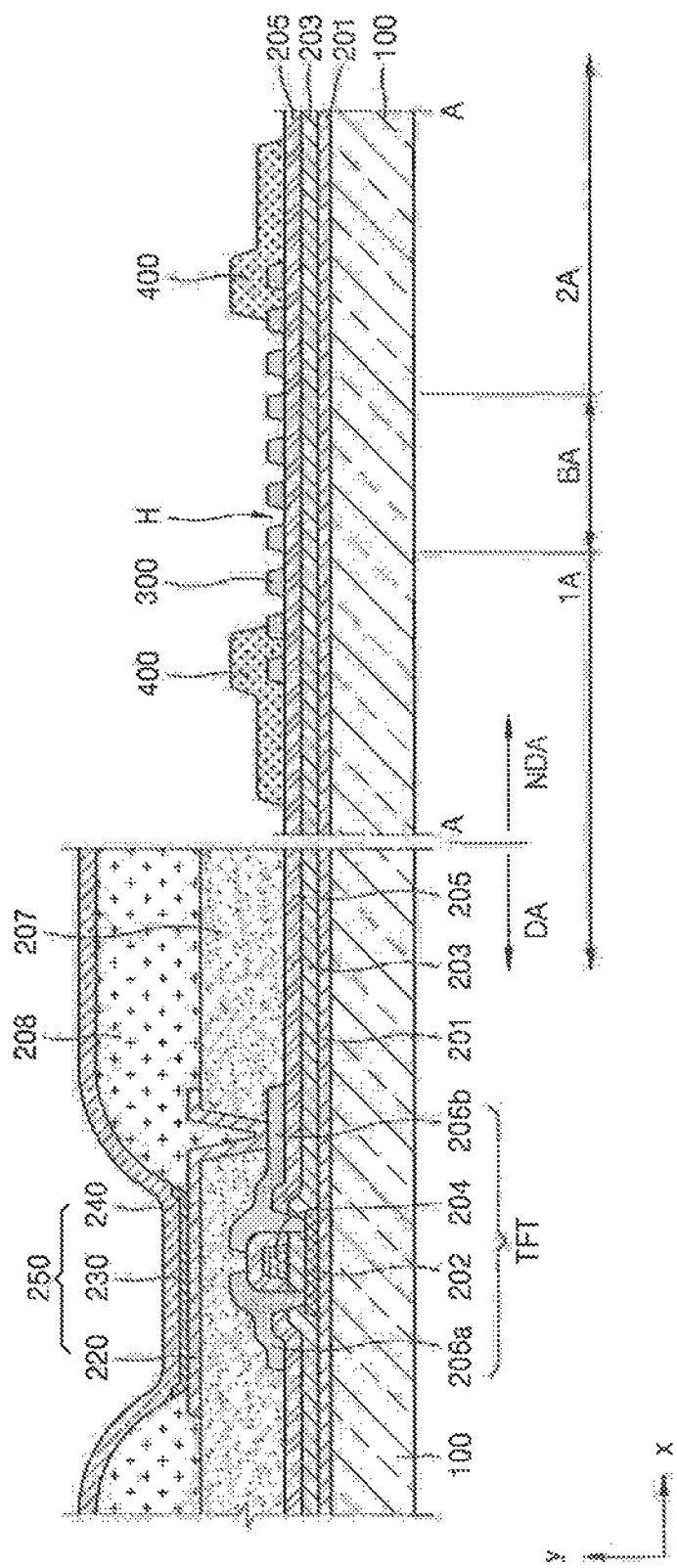
FIG. 9 is a cross-sectional view illustrating a portion of a display apparatus according to an exemplary embodiment of the present inventive concept.

FIG. 8 is a planar view illustrating a portion of a display apparatus according to an exemplary embodiment of the present inventive concept. FIG. 9 illustrates a planar view of a portion of a display apparatus according to an exemplary embodiment of the present inventive concept.

Referring to FIG. 8, a first wire unit 310*u* may be disposed at one side of a bending area BA. A second wire unit 320*u* may be disposed at the other side of the bending area BA. A dummy wire unit 300*u* may be disposed between the first wire unit 310*u* and the second wire unit 320*u*. Thus, the first wire unit 310*u* may be spaced apart from the second wire unit 320*u* by a predetermined distance. An electrical wire might not be disposed in an area between the first wire unit 310*u* and the second wire unit 320*u*. The dummy wire unit 300*u* may be disposed between the first wire unit 310*u* and the second wire unit 320*u*. Referring to FIG. 8, the bending area BA may have substantially the same structure as the bending area BA of FIG. 4. In addition, FIG. 8 also illustrates a portion of the first area 1A and the second area 2A.

Referring to FIGS. 4 and 8, the dummy wire unit 300*u* according an exemplary embodiment of the present invention may include the plurality of dummy wires 300 and an insulating film 400. The insulating film 400 may be disposed at ends of each of the plurality of dummy wires 300. The ends of each of the plurality of dummy wires 300 may extend towards the first area 1A and the second area 2A. An end of each of the plurality of dummy wires 300 may be located on the first area 1A and the other end thereof may be located on the second area 2A.

As described with reference to FIG. 4, the plurality of dummy wires 300 may be disposed on the bending area BA. The plurality of dummy wires 300 might not be electrically connected to the display unit 200 or the pad unit 500. Thus, the plurality of dummy wires 300 may be disconnected from the first area 1A or the second area 2A. The plurality of first wires 310 and the plurality of second wires 320 may each be electrically connected to the display unit 200 or the pad unit 500. Accordingly, delamination may occur at both ends of each of the plurality of dummy wires 300.

In the display apparatus according to an exemplary embodiment of the present inventive concept, the insulating film 400 may be disposed at both ends of each of the plurality of dummy wires 300. The insulating film 400 may be an inorganic insulating film, an organic insulating film, or an organic-inorganic hybrid film.

Referring to FIG. 8, the insulating film 400 may have an integral form and may cover both ends of the dummy wire unit 300*u*. Alternatively, according to an exemplary embodiment of the present inventive concept, the insulating film 400 may be patterned, for example, so as to be provided on each of the dummy wires 300.

FIG. 9 is a cross-sectional view illustrating a portion of a display apparatus according to an exemplary embodiment of the present inventive concept. FIG. 9 is a cross-sectional view illustrating a portion of a dummy wire 300, taken along a line A-A of FIG. 8 according to an exemplary embodiment of the present inventive concept.

The insulating film 400 may include substantially the same material as a planarization film 207. Alternatively, the insulating film 400 may be a film including an insulating material. The insulating film 400 may include substantially the same material as a pixel-defining film 208 or the like. The insulating film 400 may be formed by an independent process.

Referring to FIG. 9, the plurality of dummy wires 300 may include substantially the same material as a source electrode 206*a* or a drain electrode 206*b* of a thin film transistor TFT. Thus, a dummy wire 300 and the source electrode 206*a* or the drain electrode 206*b* of the thin film transistor TFT may be formed by the same process and may be disposed in the same layer. The dummy wire 300 disposed in the same layer as the source electrode 206*a* or the drain electrode 206*b* may refer to the dummy wire 300 to be disposed on an interlayer insulating film 205.

The first wire unit 310*u*, for example, may be a data wire. The first wire unit 310*u* may extend towards the first area 1A and the second area 2A. The first wire unit 310*u* may be electrically connected to the display unit 200 in the first area 1A. The first wire unit 310*u* may be electrically connected to the pad unit 500 in the second area 2A.

The first wire unit 310*u* may include the plurality of first wires 310. Each of the plurality of first wires 310 may include a 1-1 wire 310*a* and a 1-2 wire 310*b*. The 1-1 wire 310*a* may be disposed in the bending area BA. The 1-2 wire 310*b* may be disposed in the first area 1A and the second area 2A.

According to an exemplary embodiment of the present inventive concept, the 1-1 wire 301*a* and the 1-2 wire 310*b* may include different materials from each other. For example, the 1-1 wire 310*a* may include substantially the same material as the source electrode 206*a* or the drain electrode 206*b* of the thin film transistor TFT. The 1-2 wire 310*b* may include substantially the same material as a gate electrode 204 of the thin film transistor TFT. In this case, the 1-1 wire 310*a* and the 1-2 wire 310*b* may be positioned in different layers from each other. As described above, when the 1-1 wire 301*a* and the 1-2 wire 310*b* are positioned in different layers, the 1-1 wire 310*a* may be electrically connected to the 1-2 wire 310*b*, for example, via a contact hole formed in an insulating film disposed between the 1-1 wire 310*a* and the 1-2 wire 310*b*. However, exemplary embodiments of the present inventive concept are not limited thereto. For example, the 1-1 wire 310*a* and the 1-2 wire 310*b* may be formed as an integral unit and may be disposed in the same layer.

The second wire unit 320*u*, for example, may be a power wire or a driving circuit wire. The second wire unit 320*u* may extend towards the first area 1A and the second area 2A. The second wire unit 320*u* may be electrically connected to the display unit 200 in the first area 1A. The second wire unit 320*u* may be electrically connected to the pad unit 500 in the second area 2A.

The second wire unit 320*u* may include a plurality of second wires 320. Each of the plurality of second wires 320 may include a 2-1 wire 320*a* and a 2-2 wire 320*b*. The 2-1 wire 320*a* may be disposed the bending area BA. The 2-2 wire 320*b* may be disposed in the first area 1A and the second area 2A.

According to an exemplary embodiment of the present inventive concept, the 2-1 wire 320*a* may include a first sub-wire 320*a*1 and a second sub-wire 320*a*2. Thus, each of the plurality of second wires 320 may include a plurality of first and second wires 320*a*1 and 320*a*2 in the bending area BA. Referring to FIG. 9, the 2-1 wire 320*a* may include the first sub-wire 320*a*1 and the second sub-wire 320*a*2; however, exemplary embodiments of the present inventive concept are not limited thereto. For example, the 2-1 wire 320*a* may include a plurality of sub-wires depending on a thickness of the 2-2 wire 320b. Such a structure may increase a flexibility of the plurality of second wires 320 disposed in the bending area BA. A pitch P2 between the first and second wires 320a1 and 320a2 may be substantially the same as the first pitch P1 between the plurality of first wires 310.

A width of the 2-2 wire 320b may be greater than a width of the 2-1 wire 320a. As described above, when the second wire unit 320u is, for example, a power wire or a driving circuit wire, a width of each of the second wires 320 included in the second wire unit 320u may be greater than a width of each of the first wires 310 included in the first wire unit 310u.

According to an exemplary embodiment of the present inventive concept, the 1-1 wire 301a and the 1-2 wire 310b may include different materials. The 1-1 wire 310a may include substantially the same material as the source electrode 206a or the drain electrode 206b of the thin film transistor TFT. The 1-2 wire 310b may include substantially the same material as the gate electrode 204 of the thin film transistor TFT. The 1-1 wire 310a and the 1-2 wire 310b may be disposed in different layers. As described above, when the 1-1 wire 310a and the 1-2 wire 310b are disposed in different layers, the 1-1 wire 310a may be electrically connected to the 1-2 wire 310b, for example, via a contact hole formed in an insulating film disposed between the 1-1 wire 310a and the 1-2 wire 310b. However, exemplary embodiments of the present inventive concept are not limited thereto. For example, the 1-1 wire 310a and the 1-2 wire 310b may be formed as an integral unit and disposed in the same layer.

FIG. 9 is a planar view illustrating a portion of a display apparatus according to an exemplary embodiment of the present inventive concept.

FIG. 9 illustrates a pixel structure of a display unit 200 provided in a display apparatus. Referring to FIG. 9, an organic light-emitting device may be a display device 250 of the display unit 200; however, exemplary embodiments of the present inventive concept are not limited thereto. For example, the display device 250 may be a liquid crystal display device or an inorganic light-emitting display device such as an ILED.

In addition to the display device 250, the display unit 200 may include a thin film transistor TFT. The thin film transistor TFT may be electrically connected to the display device 250. According to an exemplary embodiment of the present inventive concept, an organic light-emitting device may be disposed in the display unit 200 as the display device 250. The organic light-emitting device may be electrically connected to the thin film transistor TFT, and may be refer to a pixel electrode 220 electrically connected to the thin film transistor TFT. The thin film transistor TFT may be disposed in the non-display area NDA disposed outside of the display area DA of the substrate 100. As described above, the thin film transistor TFT positioned in the non-display area NDA may be, for example, a portion of a circuit unit for controlling an electrical signal applied to the display unit 200.

A buffer layer 201 may be disposed on the substrate 100. A semiconductor layer 202 may be disposed on the buffer layer 201. The buffer layer 201 may include silicon oxide, silicon nitride, or the like. The semiconductor layer 202 may be disposed on the buffer layer 201, for example, such that a plane of the substrate 100 is planarized. Additionally, the buffer layer 201 may reduce or prevent impurities from penetrating into the semiconductor layer 202 of the thin film transistor TFT.

A gate electrode 204 may be disposed over an upper portion of the semiconductor layer 202. The source electrode 206a and the drain electrode 206b may be electrically connected to each other and may transmit and receive signals according to signals transmitted to the gate electrode 204. The gate electrode 204 may include one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). The material included in the gate electrode 204 may be selected, for example, in correspondence to adhesives with adjacent layers, surface planarization of a stacked layer, and workability. The gate electrode 204 may have a single-layered structure or a multi-layered structure.

A gate insulating film 203 may be disposed between the semiconductor layer 202 and the gate electrode 204. The gate insulating film 203 may insulate the semiconductor layer 202 from the gate electrode 204. The gate insulating film 203 may include silicon oxide and/or silicon nitride.

An interlayer insulating film 205 may be disposed on an upper portion of the gate electrode 204. The interlayer insulating film 205 may include silicon oxide or silicon nitride. The interlayer insulating film 205 may have a single layered structure or a multi-layered structure.

The source electrode 206a and the drain electrode 206b may be disposed on an upper portion of the interlayer insulating film 205. The source electrode 206a and the drain electrode 206b may each be electrically connected to the semiconductor layer 202, for example, via a contact hole formed in the interlayer insulating film 205 and the gate insulating film 203. The source electrode 206a and the drain electrode 206b may include one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). The source electrode 206a and the drain electrode 206b may each have a single layered structure or a multi-layered structure.

A protective film may be disposed on thin film transistor TFT. The protective film may at least partially cover the thin film transistor TFT. The protective film may protect the thin film transistor TFT. The protective film may include, for example, an inorganic material such as silicon oxide, silicon nitride, or silicon oxynitride.

A planarization film 207 may be disposed on the substrate 100. The planarization film 207 may be a protective film. When an organic light-emitting device is disposed over an upper portion of the thin film transistor TFT, the planarization film 207 may substantially planarize an upper surface of the thin film transistor TFT. The planarization film 207 may also protect the thin film transistor TFT and various devices. The planarization film 207 may include, for example, an acrylic-based organic material, benzocyclobutene (BCB), or the like. The buffer layer 201, the gate insulating film 203, the interlayer insulating film 205, and the planarization film 207 may be formed over a frontal surface of the substrate 100.

A pixel-defining film 208 may be disposed over the upper portion of the thin film transistor TFT. The pixel-defining film 208 may be disposed over the planarization film 207. The pixel defining film 208 may have an opening. The pixel-defining film 208 may define a pixel area on the substrate 100.

The pixel-defining film 208 may be an organic insulating film. The organic insulating film may include an acrylic-based polymer, for example, polymethyl methacrylate (PMMA), polystyrene (PS), a polymer derivative having a phenol group, an imide-based polymer, an aryl ether-based polymer, an amide-based polymer, a fluorinated polymer, a p-xylene-based polymer, a vinyl alcohol-based polymer, or a combination thereof.

The display device 250 may be disposed over an upper portion of the planarization film 207. The display device 250 may include the pixel electrode 220, an intermediate layer 230, and an opposite electrode 240. The intermediate layer 230 may include an emission layer EML.

The pixel electrode 220 may be formed as a semi-transparent electrode, a transparent electrode, or a reflective electrode. When the pixel electrode 220 is a semi-transparent electrode or a transparent electrode, the pixel electrode 220 may include, for example, ITO, IZO, ZnO, $In_2O_3$, IGO, or AZO. When the pixel electrode 220 is a reflective electrode, the pixel electrode 220 may include a reflective film including Ag, Mg, Al, Pt, Pd, Au, Ni, Nd, Ir, Cr, or a compound thereof. The pixel electrode 220 may also include a layer including ITO, IZO, ZnO, $In_2O_3$, IGO, or AZO. However, exemplary embodiments of the present inventive concept are not limited thereto. The pixel electrode 220 may include various materials. A structure of the pixel electrode 220 may vary. The pixel electrode 220 may have a single layered structure or a multi-layered structure.

The intermediate layer 230 may be disposed in a pixel area defined by the pixel-defining film 208. The intermediate layer 230 may include the emission layer EML. The emission layer EML may emit light, for example, by using an electrical signal. The intermediate layer 230 may be formed by stacking a hole injection layer HIL, a hole transport layer HTL, an electron transport layer ETL, an electron injection layer EIL, or the like, in a single or complex structure.

According to an exemplary embodiment of the present inventive concept, the hole injection layer HIL may be disposed between the emission layer EML and the pixel electrode 220. The electrode transport layer ETL may be disposed between the emission layer EML and the opposite electrode 240. However, the intermediate layer 230 is not limited thereto, and may have various structures.

The opposite electrode 240 may be disposed over at least a portion of the frontal surface of the substrate 100. The opposite electrode 240 may cover at least a portion of the intermediate layer 230 including the emission layer EML. The opposite electrode 240 may face the pixel electrode 220. The opposite electrode 240 may be semi-transparent electrode, a transparent electrode, or a reflective electrode.

When the opposite electrode 240 is a semi-transparent electrode or a transparent electrode, the opposite electrode 240 may have a layer including a metal with a relatively small working function, for example, Li, Ca, LiF/Ca, LiF/Al, Al, Ag, Mg, or a compound thereof. The opposite electrode 240 may also include a semi-transparent conductive layer or a transparent conductive layer, for example, including ITO, IZO, ZnO, or $In_2O_3$. When the opposite electrode 240 is a reflective electrode, the opposite electrode 240 may include a layer including Li, Ca, LiF/Ca, LiF/Al, Al, Ag, Mg, or a compound thereof. However, a configuration and a material of the opposite electrode 240 are not limited thereto.

According to an exemplary embodiment of the present inventive concept, functional layers such as a sealing layer, a polarizing layer, and a color filter may be disposed in an upper portion of the opposite electrode 240.

Referring to FIG. 9, the plurality of dummy wires 300 may be disposed on the interlayer insulating film 205. As described with reference to FIG. 8, the insulating film 400 may be disposed at both ends of the plurality of dummy wires 300. Thus, the insulating film 400 may cover the ends of the plurality of dummy wires 300.

FIGS. 10 to 14 each are cross-sectional views illustrating a portion of a display apparatus according to an exemplary embodiment of the present inventive concept. In FIGS. 10 to 14, a structure of each non-display area NDA including the bending area BA may be different from the aforementioned exemplary embodiments of the present inventive concept. Hereinafter, the differences therebetween will be described in more detail below.

Figure 10:
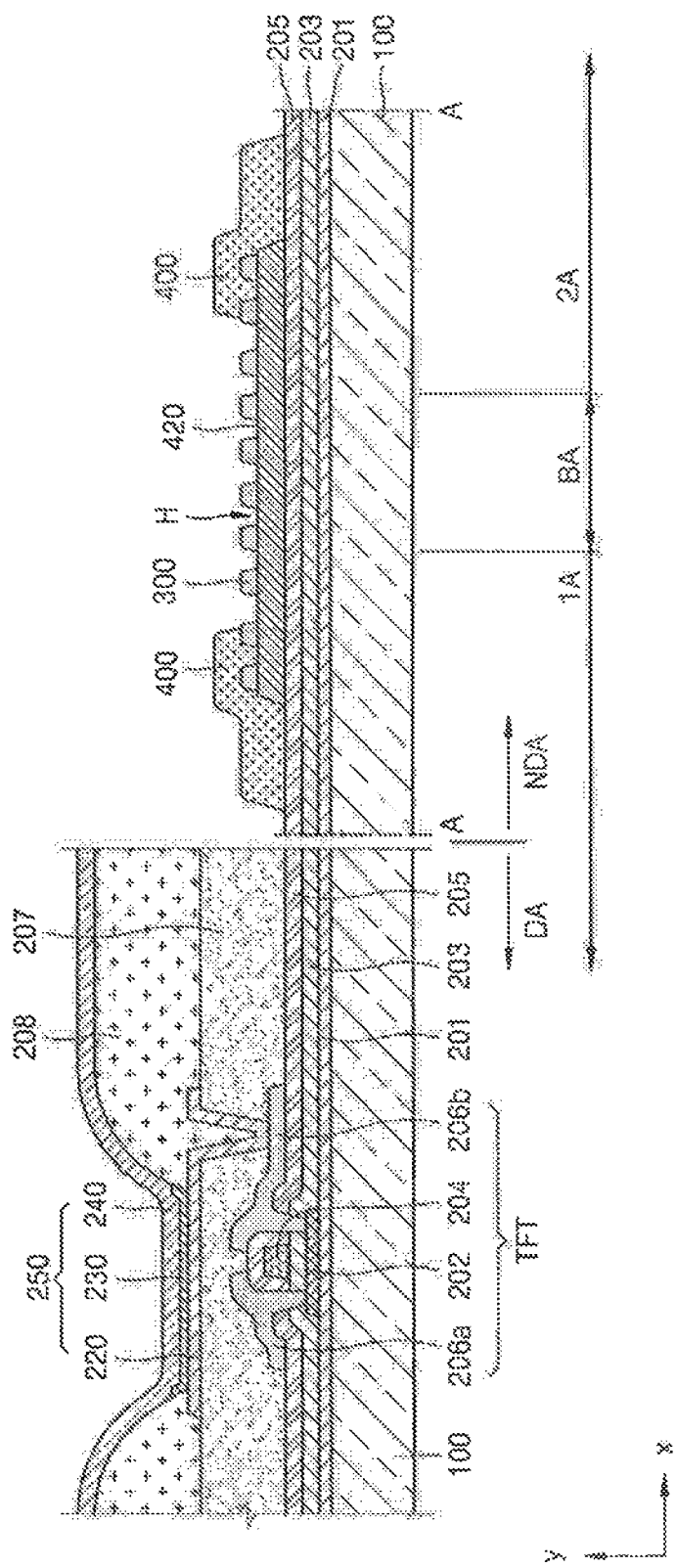
FIG. 10 is a cross-sectional view illustrating a portion of a display apparatus according to an exemplary embodiment of the present inventive concept.

Referring to FIG. 10, the plurality of dummy wires 300 may be disposed on an organic layer 420. Thus, the organic layer 420 may be disposed below lower surfaces of the plurality of dummy wires 300. The organic layer 420 may be disposed over the bending area BA. Referring to FIG. 10, the organic layer 420 may extend to an outside of the bending area BA. The organic layer 420 may overlap with portions of each of the first area 1A and the second area 2A.

The organic layer 420 may be less hard than an inorganic insulating film including the buffer layer 201, the gate insulating film 203, and the interlayer insulating film 205. Thus, when a the substrate 100 is bent, a tensile stress applied to the dummy, first and second wire units 300u, 310u, and 320u of FIG. 8 may be reduced. Accordingly, a formation of a crack in the dummy, first, and second wire units 300u, 310u, and 320u may be reduced or prevented.

Figure 11:
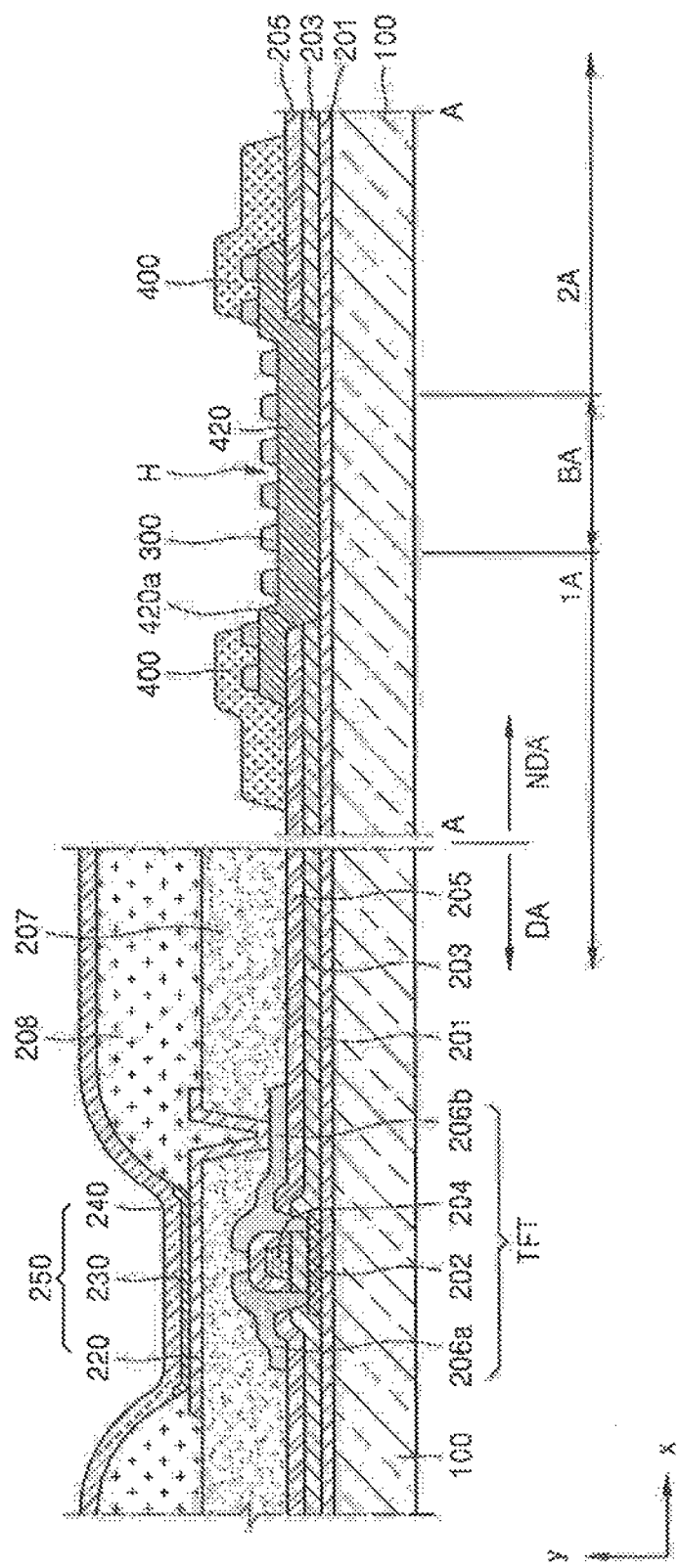
FIG. 11 is a cross-sectional view illustrating a portion of a display apparatus according to an exemplary embodiment of the present inventive concept.

Referring to FIG. 10, the organic layer 420 may be disposed on the interlayer insulating film 205. Referring to FIG. 11, the organic layer 420 may be disposed to cover at least portions of an opening 420a formed in an inorganic insulating layer. For example, the organic layer 420 may cover the entirety of the opening 420a.

Figure 12:
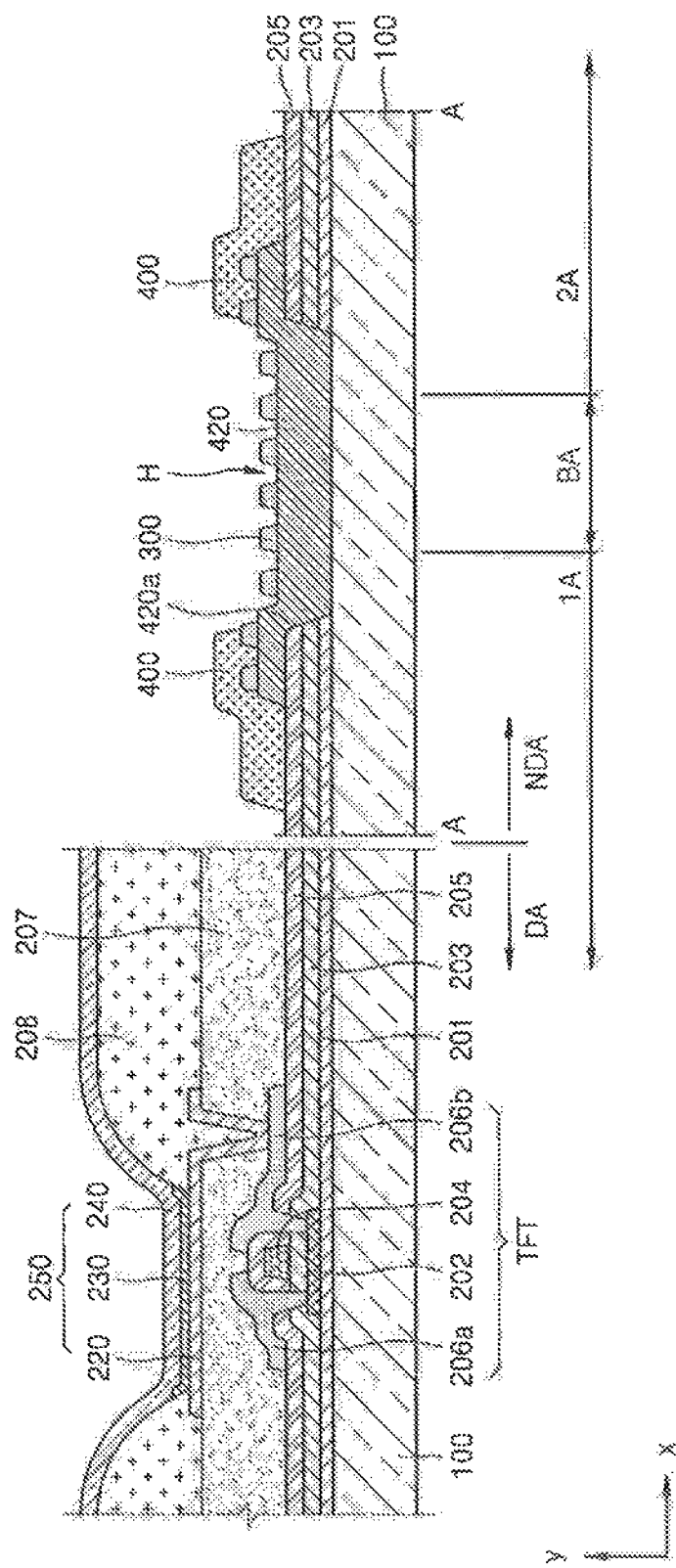
FIG. 12 is a cross-sectional view illustrating a portion of a display apparatus according to an exemplary embodiment of the present inventive concept.

Referring to FIG. 11 the opening 420a may be formed in the gate insulating film 203 and the interlayer insulating film 205. Referring to FIG. 12, the opening 420a may be formed in the gate insulating film 203, the interlayer insulating film 205, and the buffer layer 201. Referring to FIG. 11, when the opening 420a is formed in the gate insulating film 203 and the interlayer insulating film 205 exposing at least portions of the buffer layer 201, the organic layer 420 may contact the buffer layer 201 via the opening 420a. Referring to FIG. 12, when the opening 420a is formed in the gate insulating film 203, the interlayer insulating film 205, and the buffer layer 201 exposing at least portions of the substrate 100, the organic layer 420 may contact the substrate 100 via the opening 420a.

According to an exemplary embodiment of the present inventive concept, the plurality of dummy wires 300 may be disposed on the organic layer 420.

Figure 13:
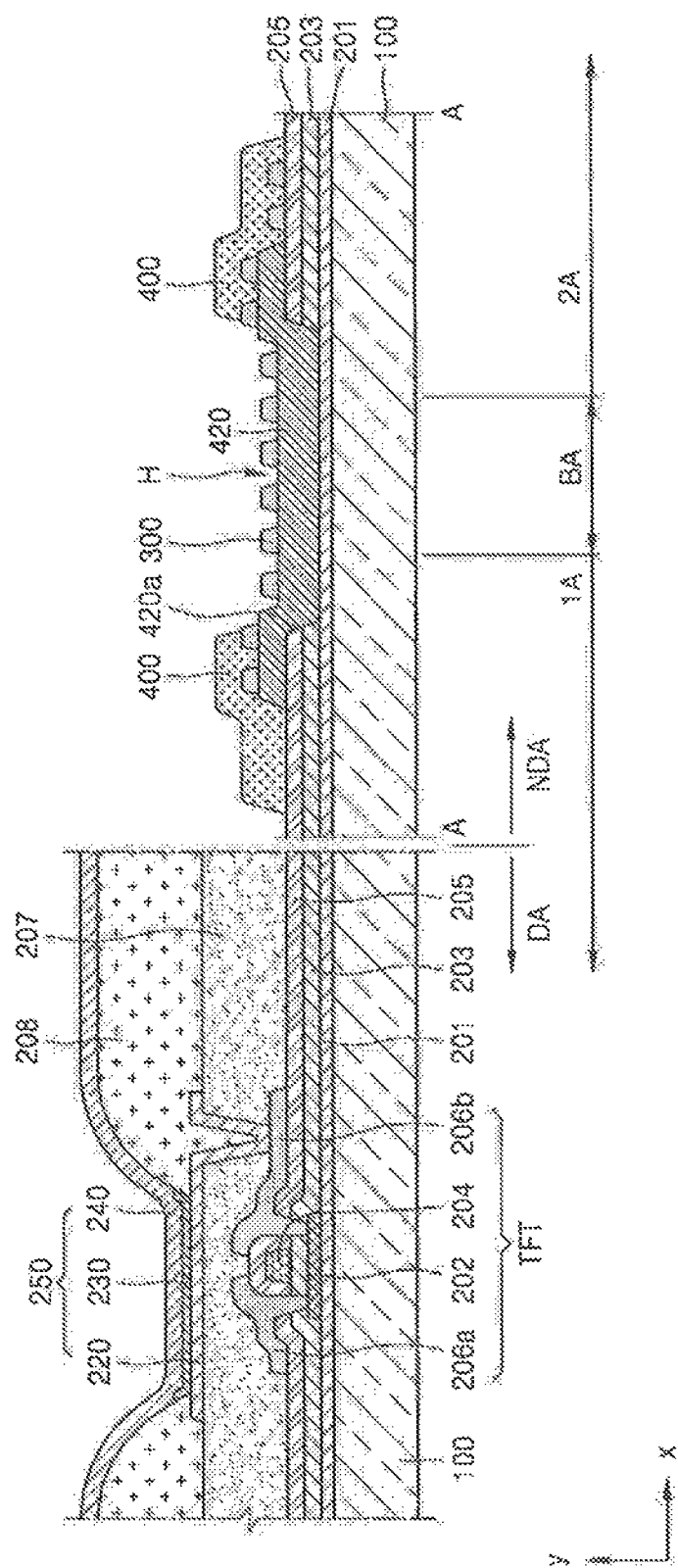
FIG. 13 is a cross-sectional view illustrating a portion of a display apparatus according to an exemplary embodiment of the present inventive concept.
Figure 14:
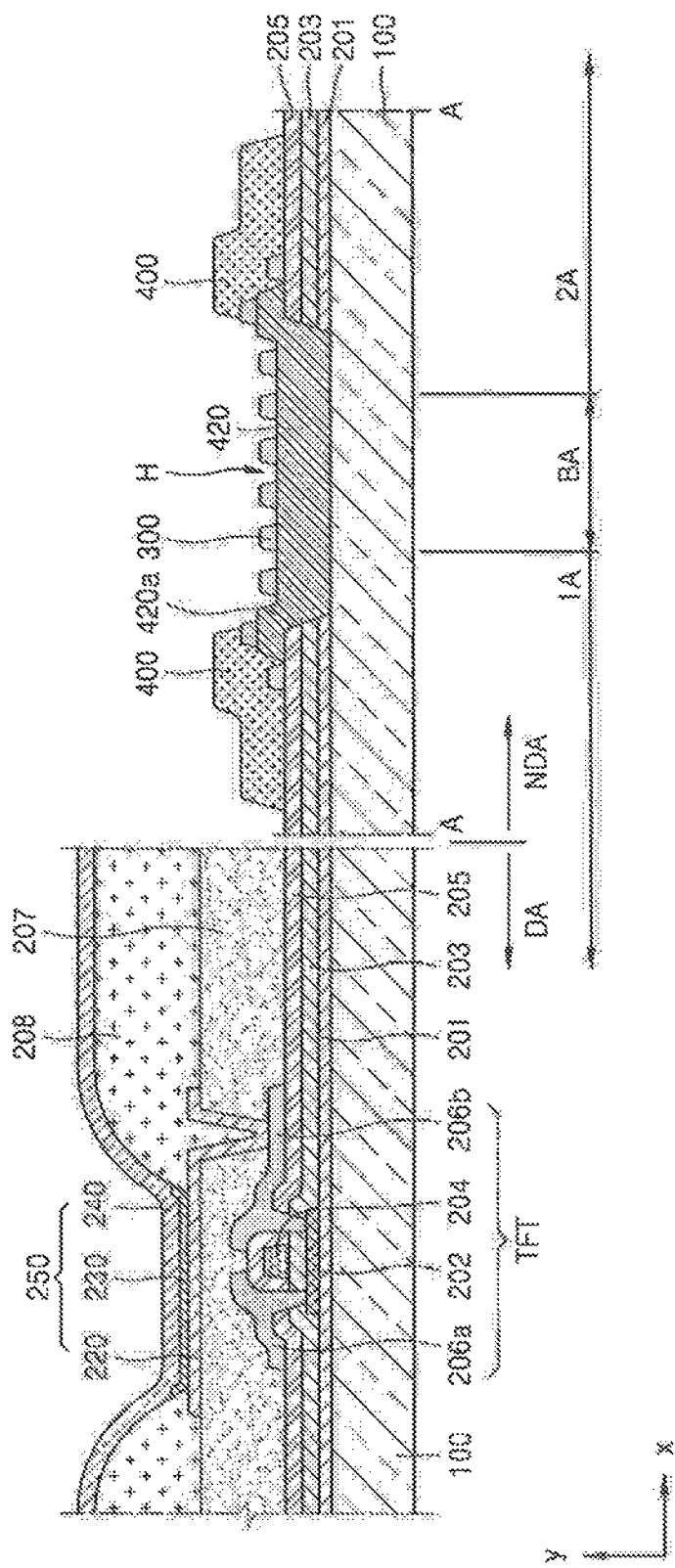
FIG. 14 is a cross-sectional view illustrating a portion of a display apparatus according to an exemplary embodiment of the present inventive concept.

Referring to FIGS. 13 and 14, the plurality of dummy wires 300 may extend to an outside of the organic layer 420. The plurality of dummy wires 300 may extend from the bending area BA, and portions thereof may be disposed in the first area 1A and the second area 2A of the substrate 100.

According to an exemplary embodiment of the present inventive concept, referring to FIG. 14, the plurality of dummy wires 300 disposed outside the opening 420a may be disposed on an edge of the organic layer 420 and the interlayer insulating film 205. Additionally, at least one of the plurality of dummy wires 300 may be disposed outside the organic layer 420. The at least one dummy wire 300 disposed outside the opening 420a may be at least partially covered by the insulating film 400. Alternatively, the insulating film 400 may be pattered to cover each of the plurality of dummy wires 300 disposed outside of the opening 420a individually.

Figure 15:
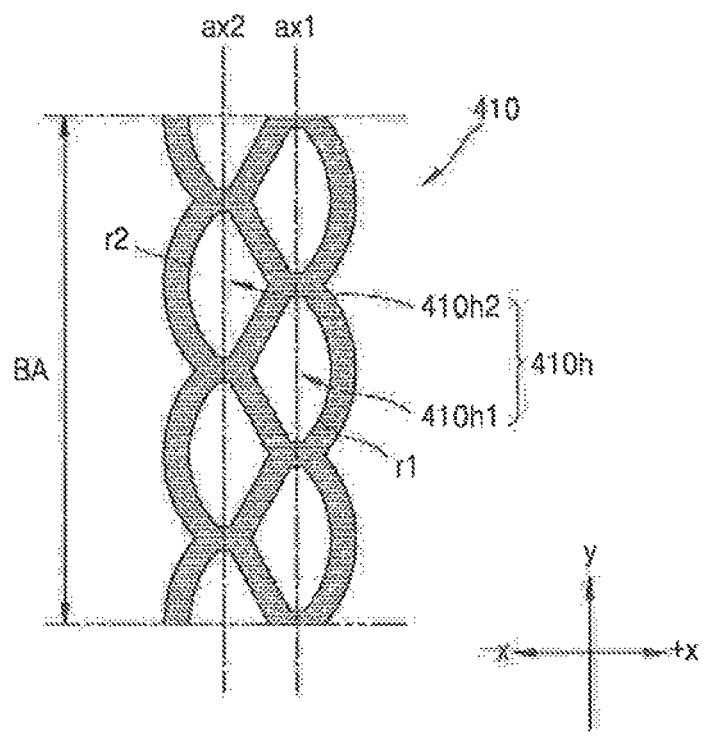
FIG. 15 is a planar view illustrating a portion of a display apparatus according to an exemplary embodiment of the present inventive concept.
Figure 16:
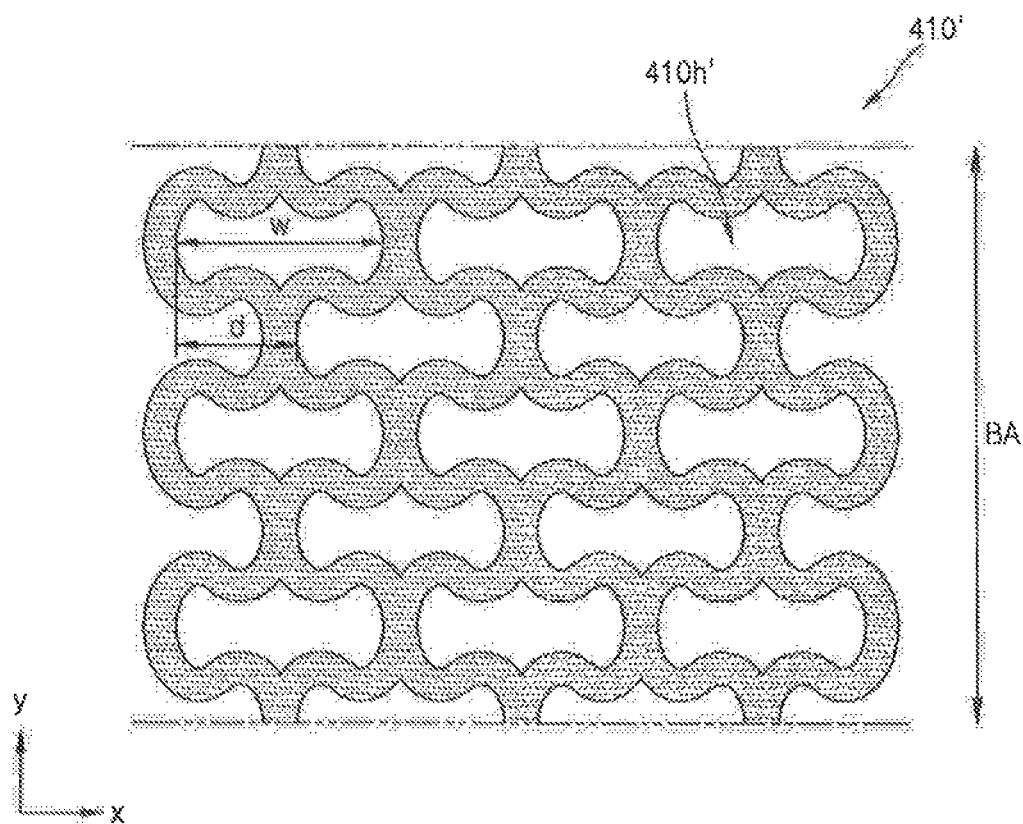
FIG. 16 is a planar view illustrating a portion of a display apparatus according to an exemplary embodiment of the present inventive concept.

FIG. 15 is a planar view illustrating a portion of a display apparatus according to an exemplary embodiment of the present inventive concept. FIG. 16 is a planar view illustrating a portion of a display apparatus according to an exemplary embodiment of the present inventive concept.

Referring to FIGS. 15 and 16, a form of wires located in the bending area BA may differ from exemplary embodiments of the present inventive concept previously described herein. The form of the wires may be applied to the first wire unit 310*u*, the second wire unit 320*u*, the third wire unit 330*u*, or the dummy wire unit 300*u* disposed in the bending area BA. Thus, exemplary embodiments of the present inventive concept as described herein with reference to FIGS. 15 and 16, the first wire unit 310*u*, the second wire unit 320*u*, the third wire unit 330*u*, and the dummy wire unit 300*u* are not individually distinguished, may be collectively referred to as a "bending wire".

Referring to FIG. 15, a bending wire 410 according to an exemplary embodiment of the present inventive concept may have a plurality of holes 410*h*. A planar form of each of the holes 410*h* may be sector-shaped. The planar form may include two relatively straight lines, in which one end of each of the lines meet at a constant angle and an arc connects the other ends of adjacent lines.

Although the planar form of each of the holes 410*h* may be sector-shaped; exemplary embodiments of the present inventive concept are not limited thereto. For example, a planar form of the holes 410*h* may be of a form including a curved line or a relatively straight line. For example, a planar shape of each of the holes 410*h* may be a polygon, a circle, an ellipse, or a portion of a polygon, a circle, or an ellipse.

According to an exemplary embodiment of the present inventive concept, the holes 410*h* may include a first hole 410*h*1 and a second hole 410*h*2. The first hole 410*h*1 may be disposed along a first axis ax1. The second hole 410*h*2 may be disposed along a second axis ax2. The second axis ax2 may be spaced apart from the first axis ax1, for example, by a predetermined distance. The first hole 410*h*1 may have a first curved portion r1. The first curved portion r1 may protrude in a second direction (e.g., a +x direction). The second hole 410*h*2 may have a second curved portion r2. The second curved portion r2 may protrude in a third direction (e.g., a –x direction). The third direction may be opposite to the second direction. The first hole 410*h*1 and the second hole 410*h*2 may be disposed to alternate with each other in a first direction (e.g., a +y direction). The first direction may intersect with each of the second direction (e.g., the +x direction) and the third direction (e.g., the –x direction).

Referring to FIG. 16, the bending wire 410' may include a plurality of holes 410*h'*.

The holes 410*h'* may be disposed so as to form a plurality of rows. However, the number of the holes 410*h'* or the rows is not limited. For example, two or more holes 410*h'* may be disposed to form two or more rows. According to an exemplary embodiment of the present inventive concept, a planar form of each of the holes 410*h'* may be substantially the same as each other as illustrated in FIG. 16. However, a planar form of the holes 410*h'* is not limited thereto.

According to an exemplary embodiment of the present inventive concept, holes 410*h'* in an $n^{th}$ row may be disposed and spaced apart from holes 410*h'* in an $n-1^{th}$ row by a first distance d in the second direction (e.g., the +x direction). Thus, holes 410*h'* of consecutively arranged rows might not be disposed at the same position with respect to a central axes thereof extending in the first direction (e.g., the +y direction). Furthermore, positions of the central axes of the holes extending in the first direction (e.g., the +y direction), may be different from each other. A central axis of the holes 410*h'* in the $n^{th}$ row may be spaced apart from a central axis of the holes 410*h'* in the $n-1^{th}$ row by the first distance d in the second direction (e.g., the +x direction). The central axis of the holes 410*h'* in the $n^{th}$ row may be spaced apart by the first distance d to the right or left with respect to the holes 410*h'* in the $n-1^{th}$ row.

As described above, the display apparatus according to an exemplary embodiment of the present inventive concept may have a structure in which the holes H are formed, for example, for flexibility of the plurality of dummy wires 300, the plurality of first wires 310, and the plurality of third wires 330 disposed in the bending area BA. The holes H may be a size of several micro-meters. The holes H may be formed by a precise patterning operation.

According to an exemplary embodiment of the present inventive concept, when dummy wire units 300*u* are not formed in the same structure, holes H of first wires 310 disposed at an outer side of the plurality of first wires 310 of the first wire unit 310*u* might not be formed in a "standard" manner. Holes H of the third wires 330 of the third wire unit 330*u*, which may be spaced apart from each other by the third pitch P3 greater than the first pitch P1 of the plurality of first wires 310, might not be formed in a "standard" manner. Holes H not being formed in a "standard" manner may refer to a defect of holes H in which the holes H are formed smaller than intended, having different sizes, or the like.

In the display apparatus according to an exemplary embodiment of the present inventive concept, the dummy wire unit 300*u* may be disposed between the first wire unit 310*u* and the second wire unit 320*u*. The plurality of dummy wires 300 may be spaced apart from each of the first wire units 310*u* and the second wire units 320*u* by the same pitch. Pattern densities of the plurality of dummy wires 300, the plurality of first wires 310, and the plurality of second wires 320 disposed in the bending area BA may be substantially the same, for example, due to a pattern compensation structure of the dummy wire unit 300*u*. Thus, when holes H are formed in the plurality of dummy wires 300, the plurality of first wires 310, and the plurality of second wires 320 located on the bending area BA by patterning, uniform patterning may be performed with relative ease.

Figure 17:
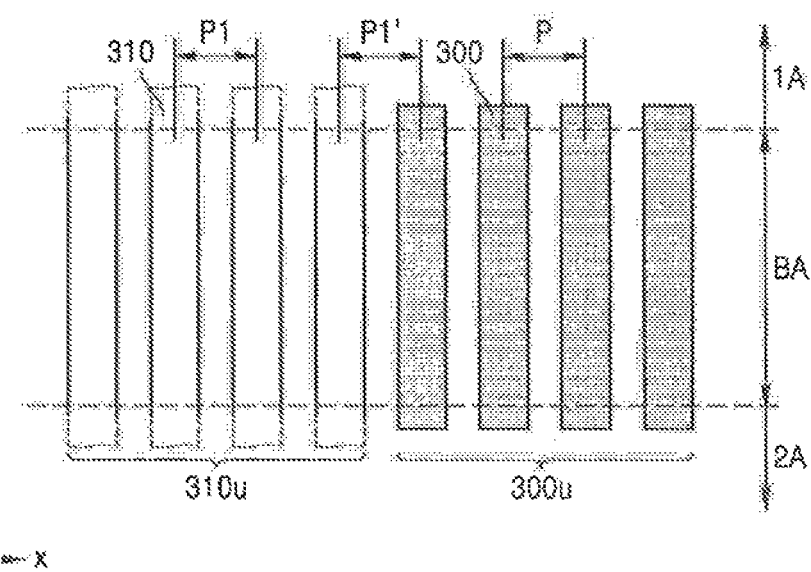
FIG. 17 is a planar view illustrating a portion of a display apparatus according to an exemplary embodiment of the present inventive concept.

FIG. 17 is a planar view illustrating a portion of a display apparatus according to an exemplary embodiment of the present inventive concept.

Referring to FIG. 17, a first wire unit and a dummy wire unit may be provided as relatively straight lines. Thus, the first wire unit and the dummy wire unit may be formed as straight lines having a simple form (e.g. no holes therein).

According to an exemplary embodiment of the present inventive concept, the plurality of first wires 310 may be spaced apart from each other by a constant distance of the first pitch P1. In addition, the plurality of dummy wires 300 disposed in the bending area BA may be spaced apart from each other by the pitch P. The pitch P may be substantially the same as the first pitch P1 of the first wires 310. A dummy wire unit 300*u* may be disposed in an area adjacent to the first wire unit 310*u*. The dummy wire unit 300*u* may be disposed in an area in which electrical wires are not located, for example, in the bending area BA.

When the dummy wire unit 300*u* is disposed adjacent to the first wire unit 310*u*, a first wire 310 of the plurality of first wires 310 most adjacent to the dummy wire unit 300*u* may be spaced apart from a dummy wire 300 by a pitch P1'. The pitch P1' may be substantially the same as the first pitch P1.

As described above, the dummy wire unit 300$u$ may be disposed in an area adjacent to the first wire unit 310$u$ and an area in which electrical wires are not located, for example, in the bending area BA. Thus, the plurality of dummy wires 300 and the plurality of first wires 310 positioned in the bending area BA may be spaced apart by the first pitch P1 and pitches P1' and P that are the same as each other.

According to one or more exemplary embodiments of the present inventive concept, a display apparatus having a longer lifetime and minimized occurrence of failures such as a disconnection during a manufacturing process may be provided. However, exemplary embodiments of the present inventive concept are not limited thereto.

It should be understood that exemplary embodiments of the present inventive concept described herein should be considered in a descriptive sense only and not for purposes of limitation. Descriptions of features or aspects within each exemplary embodiment should typically be considered as available for other similar features or aspects in other exemplary embodiments.

While one or more exemplary embodiments of the present inventive concept have been described with reference to the figures, it will be understood by those of ordinary skill in the art that various changes in form and details may be made therein without departing from the spirit and scope as defined by the following claims.

What is claimed is:

1. A display apparatus, comprising:
    a substrate comprising a first area, a second area, and a bending area between the first area and the second area, wherein the bending area is configured to be bent;
    a display unit in the first area; and
    a wire unit comprising a plurality of wires over the bending area of the substrate, wherein the plurality of wires are spaced apart from each other in the bending area by substantially a same pitch;
    wherein the plurality of wires comprise a plurality of first wires electrically connected to the display unit and a plurality of second wires, and each of the plurality of first wires is connected to a data line and the plurality of second wires are provided as dummy wires.

2. The display apparatus of claim 1, wherein each of the plurality of wires comprises a plurality of holes in the bending area.

3. The display apparatus of claim 1, wherein the plurality of wires further comprise a plurality of third wires electrically connected to the display unit, and each of the plurality of third wires is connected to at least one of a power wire and a driving circuit wire.

4. The display apparatus of claim 3, wherein the plurality of second wires are disposed between the plurality of first wires and the plurality of third wires.

5. The display apparatus of claim 1, wherein the plurality of wires further comprise a plurality of third wires, and at least two of the plurality of third wires are connected to a power wire or a driving circuit wire.

6. The display apparatus of claim 1, wherein the plurality of wires further comprise a plurality of fourth wires electrically connected to the display unit, wherein the plurality of fourth wires are spaced apart from each other by a second pitch, wherein the second pitch is greater than the pitch.

7. The display apparatus of claim 6, wherein the second pitch is n times the pitch, n≥2, wherein n is a natural number.

8. The display apparatus of claim 6, wherein at least one or more of the plurality of second wires are disposed between the plurality of fourth wires in the bending area.

9. The display apparatus of claim 8, wherein the plurality of second wires disposed between the plurality of fourth wires are spaced apart from each other by the pitch.

10. The display apparatus of claim 8, wherein a fourth wire of the plurality of fourth wires and a second wire of the plurality of second wires adjacent to each other are spaced apart from each other by the pitch.

11. The display apparatus of claim 1, wherein the plurality of second wires are not electrically connected to the display unit.

12. The display apparatus of claim 1, further comprising:
    an inorganic insulating layer disposed on the substrate, the inorganic insulating layer comprising an opening corresponding to the bending area,
    wherein ends of each of the plurality of second wires extend outside the opening.

13. The display apparatus of claim 12, further comprising:
    an organic layer filling at least portions of the opening, the organic layer disposed between the substrate and the plurality of first wires and between the substrate and the plurality of second wires,
    wherein ends of each of the plurality of second wires extend to outside the organic layer.

14. The display apparatus of claim 12, wherein an end of each of the plurality of second wires is disposed in the first area and another end of each of the plurality of second wires is disposed in the second area.

15. The display apparatus of claim 14, wherein an insulating film is disposed on ends of each of the plurality of second wires, and the insulating film covers ends of each of the plurality of second wires.

16. The display apparatus of claim 1, further comprising:
    a thin film transistor disposed in the first area or the second area, the thin film transistor comprising a source electrode, a drain electrode, and a gate electrode,
    wherein the plurality of second wires comprise substantially a same material as a material included in the source electrode or the drain electrode.

17. The display apparatus of claim 16, wherein
    a portion of the plurality of wires disposed in the bending area comprises substantially a same material as a material included in the source electrode or the drain electrode, and a portion of the plurality of wires disposed in the first area and the second area comprises substantially a same material as a material included in the gate electrode.

18. The display apparatus of claim 16, wherein each of the plurality of wires has the same length in a first direction.

19. A display apparatus, comprising:
    a substrate comprising a first area, a second area, and a bending area between the first area and the second area, wherein the bending area is configured to be bent;
    a display unit in the first area; and
    a wire unit electrically connected to the display unit and comprising a plurality of wires over the bending area of the substrate, wherein the plurality of wires are spaced apart from each other in the bending area by substantially a same pitch;
    wherein the plurality of wires comprising a first wire and a second wire, and the first wire connected to a data line and the second wire are provided as a dummy wire.

* * * * *